(12) United States Patent
McEnaney et al.

(10) Patent No.: US 12,186,728 B2
(45) Date of Patent: Jan. 7, 2025

(54) SYSTEMS AND PROCESSES FOR PRODUCING FIXED-NITROGEN COMPOUNDS

(71) Applicant: Nitricity Inc., San Francisco, CA (US)

(72) Inventors: Joshua Michael McEnaney, East Palo Alto, CA (US); John Anthony Schwalbe, Palo Alto, CA (US); Nicolas Hunter Pinkowski, Stanford, CA (US); Brian Andrew Rohr, Palo Alto, CA (US)

(73) Assignee: Nitricity Inc., San Francisco, CA (US)

( * ) Notice: Subject to any disclaimer, the term of this patent is extended or adjusted under 35 U.S.C. 154(b) by 246 days.

(21) Appl. No.: 17/240,768

(22) Filed: Apr. 26, 2021

(65) Prior Publication Data
US 2021/0331135 A1 Oct. 28, 2021

Related U.S. Application Data

(60) Provisional application No. 63/015,651, filed on Apr. 26, 2020.

(51) Int. Cl.
*B01J 19/12* (2006.01)
*B01D 53/14* (2006.01)
(Continued)

(52) U.S. Cl.
CPC ............ *B01J 19/122* (2013.01); *B01D 53/14* (2013.01); *B01D 53/78* (2013.01); *B01J 4/001* (2013.01);
(Continued)

(58) Field of Classification Search
CPC . B01J 19/122; B01J 4/001; B01J 4/008; B01J 12/002; B01J 19/0053; B01J 19/088;
(Continued)

(56) References Cited

U.S. PATENT DOCUMENTS 2,485,479 A * 10/1949 Cotton .................. C01B 21/203
204/179
4,141,715 A 2/1979 Wyse et al.
(Continued)

FOREIGN PATENT DOCUMENTS

CA 3036980 3/2018
CN 104291282 1/2015
(Continued)

OTHER PUBLICATIONS

Anastasopoulou, A. Conceptual Process Design of Plasma-Assisted Nitrogen Fixation through Energy, Environmental and Economic Assessment, Environmental and Economic Assessment, Technische Universiteit Eindhoven, Sep. 19, 2018 (189 pages).
(Continued)

*Primary Examiner* — Xiuyu Tai
(74) *Attorney, Agent, or Firm* — Gregory P. Durbin; Polsinelli PC

(57) ABSTRACT

Systems and methods for producing nitrates, nitric acid, salts thereof, or a mixture thereof are disclosed. The systems may include a feed conduit configured for receiving a feed stream comprising molecular oxygen and molecular nitrogen; an inlet conduit configured for receiving an inlet stream; a plasma reactor fluidically coupled to the inlet conduit, the plasma reactor fluidically coupled to a reactor-outlet conduit configured for receiving the reactor-outlet stream, the plasma reactor configured to produce oxidized nitrogen species; and an absorber fluidically coupled to the reactor-outlet conduit, the absorber configured to receive the reactor outlet stream and to produce nitrates, nitrites, nitric acid, salts thereof, or a mixture thereof from the reactor outlet stream. A recycle conduit may be fluidically coupled to the absorber and the inlet conduit, wherein the recycle conduit is configured to receive the gas-phase stream from the
(Continued)

absorber and provide the gas-phase stream to the inlet conduit.

17 Claims, 9 Drawing Sheets

(51) Int. Cl.

| | | |
|---|---|---|
| *B01D 53/78* | (2006.01) | |
| *B01J 4/00* | (2006.01) | |
| *B01J 12/00* | (2006.01) | |
| *B01J 19/00* | (2006.01) | |
| *B01J 19/08* | (2006.01) | |
| *H01J 37/32* | (2006.01) | |
| *C05C 5/00* | (2006.01) | |
| *C05C 11/00* | (2006.01) | |

(52) U.S. Cl.
CPC ............ *B01J 4/008* (2013.01); *B01J 12/002* (2013.01); *B01J 19/0053* (2013.01); *B01J 19/088* (2013.01); *H01J 37/32082* (2013.01); *H01J 37/32192* (2013.01); *H01J 37/3244* (2013.01); *H01J 37/32743* (2013.01); *H01J 37/32844* (2013.01); *B01J 2219/00162* (2013.01); *B01J 2219/0805* (2013.01); *B01J 2219/0807* (2013.01); *B01J 2219/0875* (2013.01); *B01J 2219/0894* (2013.01); *C05C 5/00* (2013.01); *C05C 11/00* (2013.01)

(58) Field of Classification Search
CPC ...... B01J 2219/00162; B01J 2219/0805; B01J 2219/0807; B01J 2219/0875; B01J 2219/0894; B01J 2219/0869; B01J 2219/083; B01J 2219/0809; B01J 2219/1206; B01J 19/129; B01J 19/126; B01J 2219/0896; B01J 2219/0883; B01D 53/14; B01D 53/78; B01D 2257/90; B01D 2251/2062; B01D 2257/406; B01D 2258/0266; B01D 53/323; B01D 53/58; B01D 53/326; H01J 37/32082; H01J 37/32192; H01J 37/3244; H01J 37/32743; H01J 37/32844; C05C 5/00; C05C 11/00; C05G 5/20; C05G 3/90; B01F 23/21321; B01F 23/211; B01F 23/2341; B01F 2101/32; B01F 23/23765; B01F 2101/48; C01B 21/203; C12M 21/04; C12M 47/18; C05F 17/15; C05F 3/00; A61L 11/00; A61L 9/145; A61L 9/22; Y02P 20/145; Y02A 40/20; Y02A 50/20; C05B 17/00; B03C 3/017; Y02E 50/30; Y02C 20/20; Y02W 30/40; H05H 1/46; H05H 1/4622

See application file for complete search history.

(56) References Cited

U.S. PATENT DOCUMENTS

| | | | |
|---|---|---|---|
| 4,297,123 A | 10/1981 | Wyse et al. | |
| 4,399,012 A * | 8/1983 | Chen | C01B 21/24 |
| | | | 423/400 |
| 4,451,436 A | 5/1984 | O'Hare | |
| 4,877,589 A | 10/1989 | O'Hare | |
| 5,192,355 A | 3/1993 | Eastin | |
| 6,193,934 B1 | 2/2001 | Yang | |
| 7,934,544 B2 | 5/2011 | Hitzman et al. | |
| 8,628,598 B1 | 1/2014 | Miller et al. | |
| 2007/0272543 A1 | 11/2007 | Burlica et al. | |
| 2009/0236215 A1 | 9/2009 | Burlica et al. | |
| 2010/0048850 A1 | 2/2010 | Dubois | |
| 2011/0286908 A1* | 11/2011 | Matsuuchi | H05H 1/46 |
| | | | 422/186 |
| 2012/0297673 A1 | 11/2012 | Keller | |
| 2013/0028820 A1 | 1/2013 | Lee et al. | |
| 2015/0299056 A1* | 10/2015 | Ingels | C12M 21/04 |
| | | | 71/21 |
| 2016/0102025 A1 | 4/2016 | Nunnally et al. | |
| 2018/0071707 A1* | 3/2018 | Salerno | C05C 11/00 |

FOREIGN PATENT DOCUMENTS

| | | |
|---|---|---|
| CN | 105294175 | 2/2016 |
| CN | 107075384 | 8/2017 |
| CN | 107875988 | 4/2018 |
| CN | 108990248 | 12/2018 |
| CN | 208667524 | 3/2019 |
| CN | 109627054 | 4/2019 |
| FR | 2709748 | 10/1995 |
| JP | 2019501007 | 1/2019 |
| TW | 201914969 | 4/2019 |
| WO | WO 2009/091978 | 7/2009 |
| WO | 2010142004 A2 | 12/2010 |
| WO | WO 2016/063302 | 4/2016 |
| WO | WO 2018/226313 | 12/2018 |

OTHER PUBLICATIONS

Hawtof et al., Catalyst-Free Highly Selective Synthesis of Ammonia from Nitrogen and Water by a Plasma Electrolytic System, Science Advances, 5:eaat5778, Jan. 11, 2019 (10 pages).

Hollevort et al., Towards Green Ammonia Synthesis Through Plasma-Driven Nitrogen Oxidation and Catalytic Reduction, Angewandte Chemie, 132(52):p. 24033-24037, Sep. 20, 2020 (14 pages).

International Searching Authority, International Search Report and Written Opinion, mailed in relationship to International Application No. PCT/US2021/029208, mailed Jul. 20, 2021 (17 pages).

International Search Report and Written Opinion mailed on Mar. 9, 2021 in International Patent Application No. PCT/US2021/035265, 10 pages.

* cited by examiner

SYSTEMS AND PROCESSES FOR PRODUCING FIXED-NITROGEN COMPOUNDS

CROSS-REFERENCE TO RELATED APPLICATION

This application claims priority to U.S. Provisional Patent Application No. 63/015,651, filed Apr. 26, 2020, entitled "A PROCESS FOR PRODUCING FIXED NITROGEN COMPOUNDS FROM AIR, WATER, AND ELECTRICITY, INCORPORATING A PLASMA REACTOR AND A RECIRCULATION LOOP," the entire contents of which are incorporated herein by reference in its entireties for all purposes.

TECHNICAL FIELD

This disclosure relates to systems and process for producing a product of nitrogen compounds.

BACKGROUND

The artificial fixation of nitrogen has enormous energy, environmental, and societal impacts. As human development continues, nitrogen fertilizers will remain important for growing the crops that feed world population and for the high yields that characterize modern agriculture.

Conventionally, ammonia, a common nitrogen fertilizer, is produced via the Haber-Bosch process by reacting $N_2$ with $H_2$ over an iron-based catalyst at high-pressure and -temperature conditions near 400° to 500° C. This process consumes more energy and contributes more greenhouse gas emissions than many other chemical processes. One reason for the large amount of greenhouse gas production is that fossil fuels are often the source of $H_2$ for the Haber-Bosch process. Typically, either coal or natural gas is catalytically converted in multiple steps before ammonia synthesis takes place. Because of the low conversion efficiency, high temperatures, and high pressures, traditional ammonia manufactures are large and centralized to be economical.

There remains a need in the art for systems and processes capable of producing nitrogen fertilizers and nitrogen compounds thereof in a more efficient and environmentally friendly manner.

SUMMARY

The present disclosure generally relates to systems and methods for producing nitrogen compounds and/or a product stream comprising such nitrogen compounds. The nitrogen compounds produced by the systems and/or methods may be NO, $NO_2$, nitrates, nitrites, nitric acid ($HNO_3$), salts thereof, or a mixture thereof. The systems and methods disclosed herein may be configured to produce nitrogen compounds without the use of the Haber-Bosch process. For instance, certain embodiments are directed to systems and methods that do not utilize fossil fuel, such as natural gas, for the production of nitrogen compounds. Rather, nitrogen compounds may be produced, at least partially, from molecular oxygen, molecular nitrogen, oxygen compounds, nitrogen compounds, and/or water. In some embodiments, the systems and methods are configured to utilize electricity generated from a renewable or green source to produce the nitrogen compounds. Additionally or alternatively, certain embodiments of the disclosure, may enable localized production near the point of use, such as on or near a farm, and/or be powered by electricity from a green or renewable source. In some embodiments, the only inputs required for producing the nitrogen compounds include water, air, and/or electricity.

The inventors discovered that several benefits can be achieved by the systems and methods disclosed herein. For example, by using electricity to synthesize oxidized nitrogen species in a gas phase, an absorber may be utilized as an effective means for capturing the NOx species and/or oxidizing the NOx species to the desired nitrogen compounds, such as nitrites, nitrates, nitric acid, and/or salts thereof. Oxidized nitrogen species may refer to compounds formed from nitrogen molecules and/or compounds (e.g., molecular nitrogen) that has been oxidized. For example, oxidized nitrogen species may refer to NO, $NO_2$, $N_2O_4$, $N_2O$, HNO, $HNO_2$, $HNO_3$, $N_2O_5$, etc. In some embodiments, the systems and methods disclosed herein may produce one or more of oxidized nitrogen species, such as those chosen from NO, $NO_2$, $N_2O_4$, $N_2O$, HNO, $HNO_2$, $HNO_3$, $N_2O_5$, and a mixture thereof.

It was also recognized that incorporating a recycle stream may offer additional advantages including, but not limited to, using the plasma produced by the plasma reactor to convert any potentially non-absorbed nitrous oxide ($N_2O$), a potent greenhouse gas, into desirable nitrogen compounds (e.g., NO, $NO_2$, $HNO_3$, nitrate, nitrite, and/or salts thereof), thereby avoiding greenhouse gas emissions.

It was also recognized that incorporating a recycle stream can allow for a mode of operation in which molecular nitrogen and oxygen are fed to the whole system at a rate similar to the rate at which they are consumed in the plasma reactor thereby eliminating the need for venting large volumes of tail gas. This enables a reduction in greenhouse gas emissions without a need for a large train of absorbers on the tail gas.

In one aspect, the present disclosure relates to a system for producing a nitrogen product comprising nitrates, nitrites, nitric acid, salts thereof, or a mixture thereof. In certain aspects, the systems include an inlet conduit configured for receiving an inlet stream, the inlet conduit fluidically coupled to the feed conduit and a recycle conduit. The feed conduit is configured for receiving a feed stream, comprising molecular oxygen and molecular nitrogen. The inlet conduit is typically configured to receive the feed stream from the feed conduit and a gas-phase stream form the recycle conduit. The system includes a plasma reactor fluidically coupled to the inlet conduit, the plasma reactor configured to receive the inlet stream and to produce a reactor-outlet stream comprising one or more oxidized nitrogen species. The plasma reactor is fluidically coupled to a reactor-outlet conduit configured for receiving the reactor-outlet stream. The system includes an absorber fluidically coupled to the reactor-outlet conduit, the absorber being configured to receive the reactor-outlet stream and to produce nitrates, nitrites, nitric acid, salts thereof, or a mixture thereof from the reactor-outlet stream. Additionally, the absorber is configured to produce a gas-phase stream and a liquid phase, the liquid phase containing at least a portion of the nitrates, nitrites, nitric acid, salts thereof, or a mixture thereof. The system includes a recycle conduit that may be fluidically coupled to the absorber and the inlet conduit, the recycle conduit being configured to receive the gas-phase stream from the absorber and provide the gas-phase stream to the inlet conduit.

According to some aspects, the system may further comprise a feed-gas-supply device configured to produce the feed stream. The feed-gas-supply device may provide a feed stream having molecular oxygen to molecular nitrogen in a weight ratio of about 1:1 to about 5:1 during use. For instance, the weight ratio of molecular oxygen to molecular nitrogen may be about 3:2 to about 4:1, during use. In another instance, the air-supply device provides a feed stream comprising or consisting of air.

In accordance with some aspects, the plasma reactor is configured to produce non-thermal plasma of oxygen, non-thermal plasma of nitrogen, or a mixture thereof. The plasma reactor may comprise glow-discharge electrodes, dielectric-barrier discharge electrodes, and/or gliding-arc discharge electrodes. In another instance, the plasma reactor may comprise thermally arcing electrodes. In some instances, the plasma reactor comprises a microwave generator or radio frequency generator for electrode-less plasma production.

According to some aspects, the absorber comprises a diffuser submerged in the liquid phase. Preferably, the liquid phrase comprises or consisting of water. Additionally or alternatively, the liquid phase may comprise a basic compound. Non-limiting examples of basic compounds include those chosen from chosen from calcium carbonate, sodium hydroxide, potassium hydroxide, and a mixture thereof. The liquid phase may comprise a catalyst. For example, the liquid phase may include a catalyst that comprises platinum, palladium, or a mixture thereof. In some instances, the absorber is a bubble absorber, a turbulent pool for gas absorption, tray column, film column, spray column, or a packed column.

In accordance with some aspects, the system further comprises one or more of a compressor and a blower fluidically coupled to the recycle conduit, wherein the feed conduit is located downstream of the one or more of a compressor and a blower. Additionally or alternatively, the system may further comprise one or more of a compressor and a blower fluidically coupled to the recycle conduit and located downstream of the feed conduit.

In another aspect, provided is another system for producing nitrates, nitrites, nitric acid, salts thereof, or a mixture thereof. The system may include a recycle conduit configured to receive a gas-phase stream; a plasma reactor fluidically coupled to the recycle conduit, the plasma reactor being configured to receive the gas-phase stream and produce a plasma of nitrogen, oxygen, or a mixture thereof. The plasma reactor is typically configured to produce a reactor-outlet stream comprising one or more oxidized nitrogen species, wherein the plasma reactor is fluidically coupled to a reactor-outlet conduit configured for receiving the reactor-outlet stream. The system includes a feed conduit configured to receive a feed stream comprising molecular oxygen and molecular nitrogen; an inlet conduit configured to receive an inlet stream, where the inlet conduit is fluidically coupled to the reactor outlet conduit and to the feed conduit. The inlet stream generally comprises the reactor outlet stream and the feed stream. The system includes an absorber fluidically coupled to the inlet conduit. The absorber is configured to receive the inlet stream and to produce nitrates, nitrites, nitric acid, salts thereof, or a mixture thereof from the inlet stream, wherein the absorber is configured to produce the gas-phase stream and a liquid phase. The liquid phase comprises at least a portion of the nitrates, nitrites, nitric acid, salts thereof, or a mixture thereof. The recycle conduit is fluidically coupled to the absorber, wherein the recycle conduit is configured to receive the gas phase stream from the absorber and provide the gas-phase stream to the plasma reactor.

According to some aspects, the plasma reactor is configured to produce non-thermal plasma of nitrogen, oxygen, or a mixture thereof. The system may further comprise a feed-gas-supply device configured to produce the feed stream. In some cases, the feed-gas-supply device provides a feed stream having molecular oxygen to molecular nitrogen in a weight ratio of about 1:1 to about 5:1.

In yet a further aspect, provided is a method for producing nitrates, nitrites, nitric acid, salts thereof, or a mixture thereof. The method typically includes producing an effluent stream comprising one or more oxidized nitrogen species from an inlet stream comprising nitrogen and oxygen using a plasma reactor, the plasma reactor producing the one or more oxidized nitrogen species by producing a plasma of nitrogen and oxygen from the inlet stream; producing one or more of NO, $NO_2$, nitric acid, nitrates, nitrites, salts thereof, or a mixture thereof from the effluent stream of oxidized nitrogen species using an absorber; removing at least a portion of the oxidized nitrogen species from the effluent stream using the absorber, such that the absorber produces a gas phase stream and a liquid phase, wherein the liquid phase comprises the produced nitrates, nitrites, nitric acid, salts thereof, or a mixture thereof from the removed portion; and recycling the gas-phase stream produced by the absorber to the inlet stream, such that the inlet stream comprises the gas phase stream.

According to certain aspects, the plasma of nitrogen and oxygen is produced as non-thermal plasma of nitrogen and oxygen. The method may remove the at least a portion of the nitrates, nitrites, nitric acid, salts thereof, or a mixture thereof from the effluent stream by bubbling the effluent stream through the liquid phase of the absorber. The liquid phase may comprise a basic compound, such as those chosen from calcium carbonate, sodium hydroxide, potassium hydroxide, and a mixture thereof. Additionally, or alternatively, the liquid phase of the absorber may include a catalyst. The catalyst may comprise platinum, palladium, or a mixture thereof.

According to certain aspects, the method further comprises providing a feed stream using a feed-gas-supply device, wherein the inlet stream comprises the feed stream. The feed stream may comprise molecular oxygen to molecular nitrogen in a weight ratio of about 1:1 to about 5:1. In at least one instance, the feed stream comprises molecular oxygen to molecular nitrogen in a weight ratio of about 3:2 to about 4:1. Additionally or alternative, the method may include a feed stream that comprises or consists of air.

In accordance with certain aspects, the method further comprises pressurizing the gas-phase stream using a blower or compressor. The method may, additionally or alternatively, further comprise pressurizing the inlet stream using a blower or compressor and/or pressurizing the effluent stream using a blower or compressor.

These and other aspects of the invention are evident in the drawings and in the description that follows.

BRIEF DESCRIPTION OF THE DRAWINGS

The disclosure is best understood from the following detailed description when read in connection with the accompany drawings, with like elements having the same reference numerals. When a plurality of similar elements are present, a single reference numeral may be assigned to the plurality of similar elements with a small letter designation referring to specific elements. When referring to the elements collectively or to a non-specific one or more of the elements, the lowercase-letter designation may be dropped. This emphasizes that according to common practice, the various features of the drawings are not drawn to scale unless otherwise indicated. On the contrary, the dimension of the various features may be expanded or reduced for clarity. Included in the drawings are the following figures.

DETAILED DESCRIPTION

The present disclosure generally relates to systems and methods for producing nitrogen compounds and/or a product stream comprising such nitrogen compounds. The nitrogen compounds produced by the systems and/or methods may be NO, $NO_2$, nitrates, nitrites, nitric acid ($HNO_3$), salts thereof, or a mixture thereof. The systems and methods disclosed herein may be configured to produce nitrogen compounds without the use of the Haber-Bosch process. For instance, certain embodiments are directed to systems and methods that do not utilize fossil fuel, such as natural gas, for the production of nitrogen compounds. Rather, nitrogen compounds may be produced, at least partially, from molecular oxygen, molecular nitrogen, oxygen compounds, nitrogen compounds, and/or water. In some embodiments, the systems and methods are configured to utilize electricity generated from a renewable or green source to produce the nitrogen compounds. Additionally or alternatively, certain embodiments of the disclosure, may enable localized production near the point of use, such as on or near a farm, and/or be powered by electricity from a green or renewable source. In some embodiments, the only inputs required for producing the nitrogen compounds include water, air, and/or electricity.

The inventors discovered that several benefits can be achieved by the systems and methods disclosed herein. For example, by using electricity to synthesize oxidized nitrogen species in a gas phase, an absorber may be utilized as an effective means for capturing the NOx species and/or oxidizing the NOx species to the desired nitrogen compounds, such as nitrites, nitrates, nitric acid, and/or salts thereof. Oxidized nitrogen species may refer to compounds formed from nitrogen molecules and/or compounds (e.g., molecular nitrogen) that has been oxidized. For example, oxidized nitrogen species may refer to NO, $NO_2$, $N_2O_4$, $N_2O$, HNO, $HNO_2$, $HNO_3$, $N_2O_5$, etc. In some embodiments, the systems and methods disclosed herein may produce one or more of oxidized nitrogen species, such as those chosen from NO, $NO_2$, $N_2O_4$, $N_2O$, HNO, $HNO_2$, $HNO_3$, $N_2O_5$, and a mixture thereof. It was also recognized that incorporating a recycle stream may offer additional advantages including, but not limited to, using the plasma produced by the plasma reactor to convert any potentially non-absorbed nitrous oxide ($N_2O$), a potent greenhouse gas, into desirable nitrogen compounds (e.g., NO, $NO_2$, $HNO_3$, nitrate, nitrite, and/or salts thereof), thereby avoiding greenhouse gas emissions.

Figure 1:
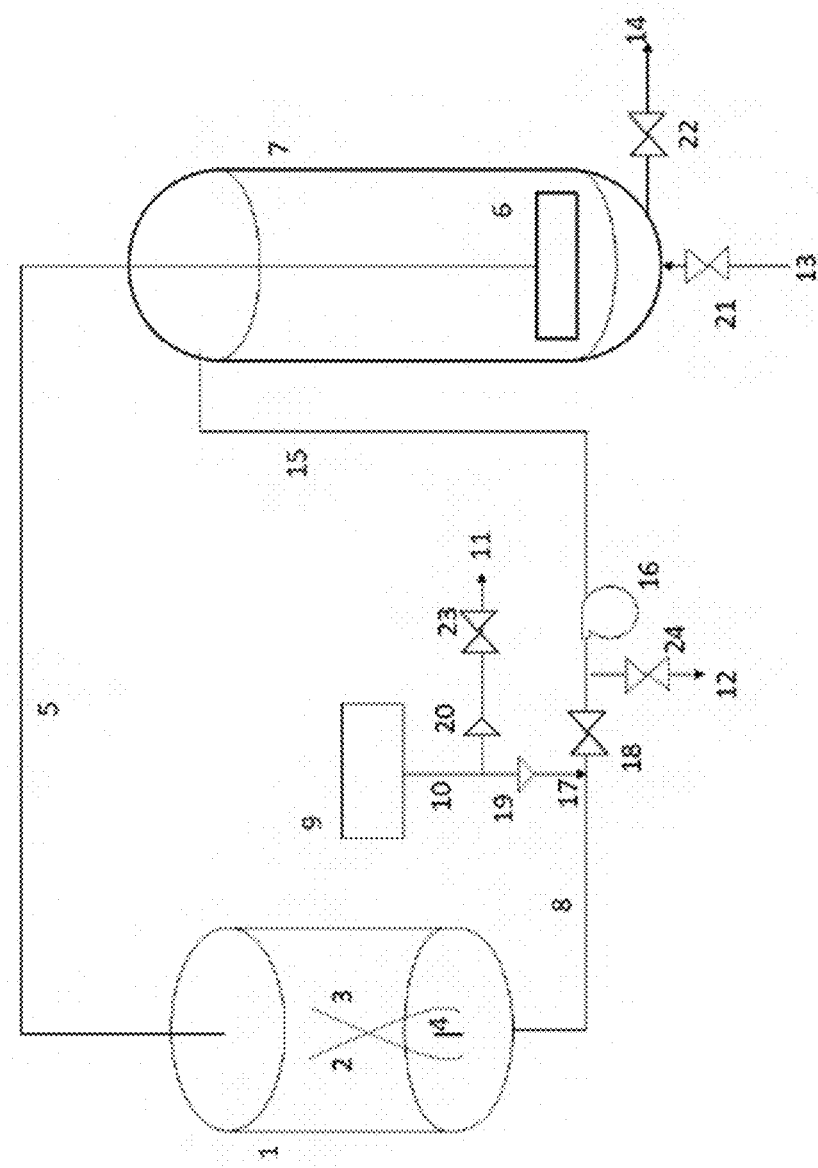
FIG. 1 illustrates a non-limiting, exemplary system for producing nitrogen compounds in accordance with aspects of the disclosure.

With reference to FIG. 1, in one embodiment, provided is a system 100 for producing nitrogen compounds. As a brief overview, system 100 includes an inlet conduit 8, plasma reactor 1, a reactor outlet conduit 5, an absorber 7, recycle conduit 15, a blower or compressor 16, a feed conduit 17, and a feed gas supply device 9.

The plasma reactor 1 of system 100 is configured to produce a plasma of nitrogen, oxygen, or a combination thereof. In one specific example, the plasma reactor is configured to produce a non-thermal plasma of nitrogen, oxygen, or a mixture thereof. Non-thermal plasma refers to any plasma that is not in thermodynamic equilibrium, e.g., because the ion temperature is different from the electron temperature or because the velocity distribution of one of the species does not follow a Maxwell-Boltzmann distribution. Because the electrons of non-thermal plasma may have a temperature that is significantly greater (e.g., orders of magnitude greater) than the other species in the reactor, it is believed that the electrons may be used for activating and/or reacting molecular nitrogen and oxygen. Without being limited to any specific theory, the following reactions illustrated in the reaction scheme below may occur between molecular nitrogen ($N_2$) and molecular oxygen ($O_2$) as a plasma during use.

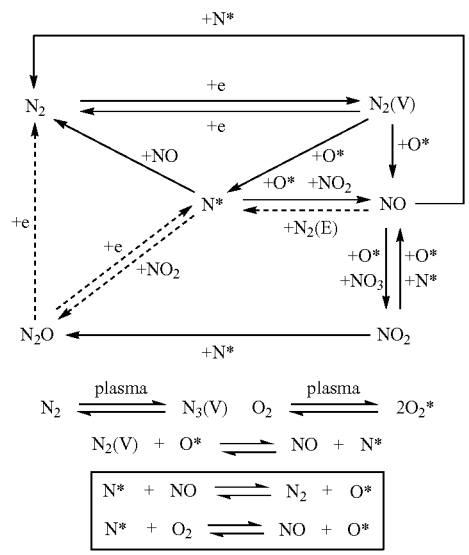

Figure 3:
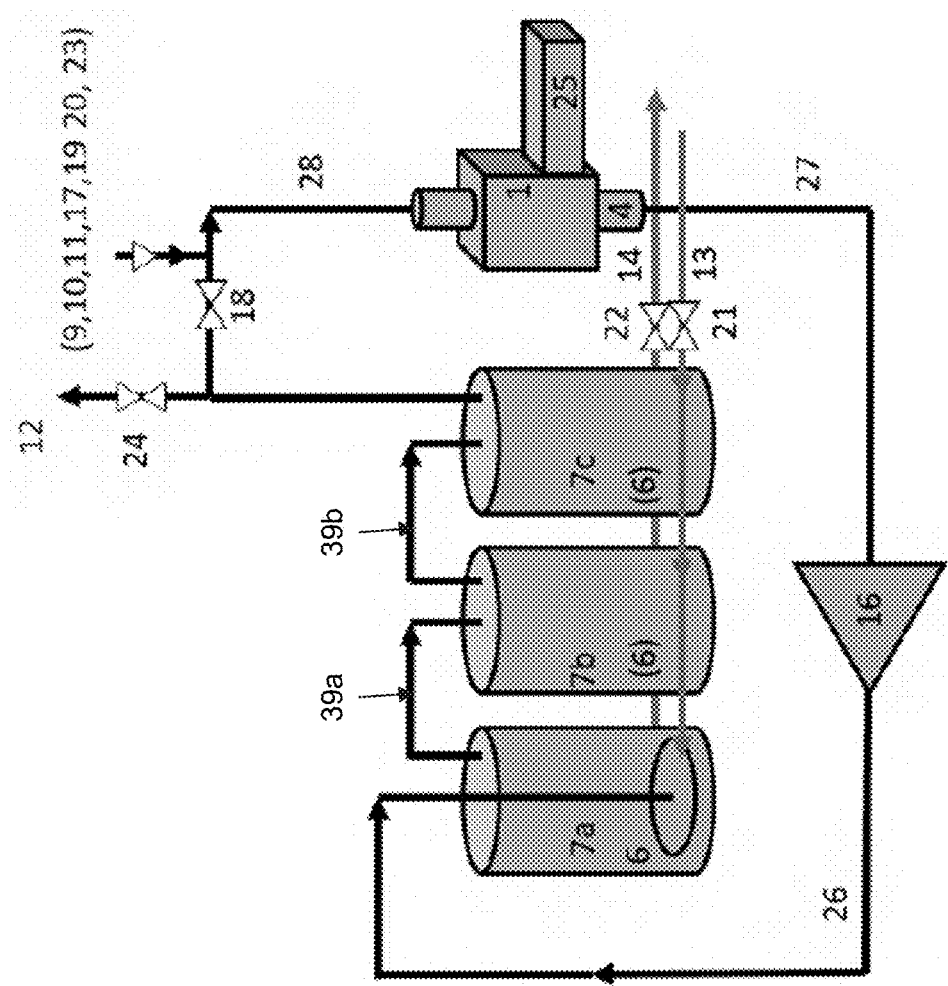
FIG. 3 illustrates a further non-limiting, exemplary system for producing nitrogen compounds that uses a plasma reactor that does not have electrodes in accordance with aspects of the disclosure.

Plasma reactor 1 may include electrodes for producing the plasma of nitrogen and/or oxygen. For example, the plasma may be generated by maintaining an adequately high voltage between two electrodes 2 and 3, e.g., in a gliding-arc configuration. In this example, the electrodes 2 and 3 shown in FIG. 1 are in a gliding-arc configuration. Alternatively, plasma reactor 1 may include, e.g., propeller-style electrodes, helical electrodes, and/or 2D electrodes. In some embodiments, the electrodes may be chosen from glow-discharge electrodes, dielectric-barrier discharge electrodes, gliding-arc discharge electrodes, and a combination thereof. The electrodes may also be hollow to allow for cooling liquids or gasses to be passed through them. Electrodes 2 and 3 may be connected via reversible mechanical means to electrical contacts for ease of maintenance. Although the plasma reactor 1 illustrated in FIG. 1 has electrodes 2 and 3, a plasma reactor may not include electrodes. For example, FIG. 3 illustrates a system 300 having a plasma reactor that does not have electrodes. Non-limiting examples of plasma reactors that do not require electrodes include microwave plasma reactors and RF plasma reactors. In one specific embodiment, the reactor outlet stream had a composition of 66 vol. % of $O_2$, 25.5 vol. % of $N_2$, 5 vol. % of NO, 2 vol. % of $NO_2$, 1.5 vol. % of other components after 30 minutes of running when a 1-20 cfm inlet stream flow rate was fed the plasma reactor, and wherein the feed stream comprised 70 vol. % of $O_2$, 29 vol. % of $N_2$, and 1 vol. % other air components. In another specific embodiment, the reactor outlet stream had a composition of 78 vol. % of $N_2$, 20 vol. % of $O_2$, 0.04 vol. % $NO_2$, and 0.025 vol. %, NO, in addition to other components after 5 minutes of running when the feed stream had a 5-20 cfm flow rate, and wherein the feed stream comprised air, the reactor stream.

Plasma reactor 1 may be configured for directing and shaping the plasma produced therein. For instance, the plasma reactor 1 may produce a magnetic field for shaping and/or directing the plasma. The magnetic field generally causes ions and electrons in plasma to travel along magnetic field lines.

Additional or alternatively, plasma reactor 1 may include a nozzle 4 to direct gas flow, maintain heat transfer, and encourage desirable thermal or non-thermal operation of the plasma reactor 1. The nozzle can change the gas flow in the reactor to move the plasma, cause the plasma to break and reform, and can change the temperature or pressure of the reactor chamber due to its shape and positioning. For example a narrow nozzle aimed at diverging electrodes will cause the plasma to glide and expand across the electrodes more rapidly than with a wide gas inlet.

Suitable plasma reactors would be readily recognized by one of ordinary skill in the art. In some cases, plasmas may be produced at pressures of about 0 to about 20 bar, preferably about 0.1 to about 5. The body of the plasma reactor may reach a temperature of about 0 to about 3000° C. In at least one embodiment, the temperature of the body of the plasma reactor is about 20 to about 500° C. The temperature of the plasma can reach much higher temperatures, such as from about 2000 to about 5000° C. Generally speaking, the plasma reactor 1 is configured to receive an inlet stream and to produce a reactor outlet stream comprising one or more oxidized nitrogen species, such as NO, $NO_2$, $N_2O_4$, $N_2O$, $HNO_2$, $HNO_3$, $N_2O_5$, or a mixture thereof.

System 100 includes an inlet conduit 8 that is fluidically coupled to the plasma reactor 1. As seen in FIG. 1, the inlet conduit 8 is also fluidically coupled to a feed conduit 17 and a recycle conduit 15. Inlet conduit 8 is configured for receiving an inlet stream. For example, inlet conduit 8 may be configured to receive the feed stream from a feed conduit 17 and a gas-phase stream from a recycle conduit 15. In some instances, inlet conduit 8 is fluidically coupled to a T-pipe connector, which is also fluidically coupled to the feed conduit 17 and the recycle conduit 15. Inlet conduit 8 may have a structure and be formed of a material that is suitable for receiving and containing the inlet stream. For example, inlet conduit 8 may be a pipe, tube, or the like having a thickness and/or structure based on the contents flowing therethrough, the pressure exerted on the conduit, and other design parameters. Inlet conduit 8 may be formed of material, such as metal, metal alloy, plastic, ceramic, or the like. One of ordinary skill would have knowledge of suitable conduits for inlet conduit 8.

The system 100 provides the reactor-outlet stream to the absorber 7. More particularly, system 100 includes a reactor-outlet conduit 5 coupled to plasma reactor 1 and configured for receiving the reactor-outlet stream from plasma reactor 1. Reactor-outlet conduit 5 is also fluidically coupled to absorber 7, such that the reactor-outlet stream can flow from plasma reactor 1 through reactor-outlet conduit 5 to absorber 7. The reactor-outlet stream may comprise one or more oxidized nitrogen species and/or ammonia. For instance, the reactor stream may comprise one or more of NO, $NO_2$, $N_2O$, ammonia, and/or nitric acid. Reactor-outlet conduit 5 may have a structure and be formed of a material, such as a metal, metal alloy, plastic, ceramic, or the like, that is suitable for receiving and containing the reactor-outlet stream. For example, reactor-outlet conduit 5 may be a pipe, tube, or the like having a thickness and/or structure based on the contents flowing therethrough, the pressure exerted on the reactor outlet conduit 5, and other design parameters. Preferably, reactor outlet conduit 5 has structure and is formed of a material that is suitable for high temperature, high pressure, and is resistant to corrosion. In at least one embodiment, reactor conduit 5 may have a liner with a high corrosion resistance coupled or attached to the inner surface of reactor conduit 5. One of ordinary skill would have knowledge of suitable conduits for reactor outlet conduit 5.

Absorber 7 is coupled to reactor outlet conduit 5 and is configured to receive the reactor outlet stream. Although absorber 7 is illustrated in FIG. 1 as having a port traversing through the top of absorber 7 for receiving the reactor-outlet stream, in some embodiments absorber 7 has a port on the bottom or bottom portion of absorber 7 for receiving reactor-outlet stream 7. Absorber 7 may be a packed column, a bubble absorption unit, a spray tower, a plate column, tray column, film column, or a turbulent pool for gas absorption. Absorber 7 may include a diffuser for diffusing the reactor outlet stream into the absorber 7. For example, the absorber 7 may be a bubble absorption unit and may contain a diffuser 6 for diffusing the reactor outlet stream, e.g., via bubble, into a liquid contained in absorber 7. In at least one embodiment, diffuser 6 is submerged in the liquid contained in absorber 7. Diffuser 6 may be a porous media constructed of ceramic, metal, or glass material.

Absorber 7 may be configured to produce nitrates, nitrites, nitric acid, salts thereof, or a mixture thereof from the reactor outlet stream. Generally, absorber 7 is configured to produce a gas phase and a liquid phase. For example, absorber 7 may be configured to produce nitrogen compounds (such as, nitrates, nitrites, nitric acid, and/or salts thereof) by dispersing the reactor outlet stream through a liquid phase contained in absorber 7. The liquid phase may be water or an aqueous solution. By dispersing the reactor outlet stream throughout the liquid phase (e.g., a liquid phase comprising or consisting of water), certain compounds of the reactor outlet stream are absorbed into the liquid phase and further oxidized to the desired nitrogen compounds. Preferably, about 50 wt. % or more of the oxidized nitrogen species in the reactor outlet stream are converted in the absorbers, based on the total volume oxidized nitrogen species in the reactor outlet stream. For example, the conversion of oxidized nitrogen species in the absorber(s) may be about 30 vol. % to about 90 vol. %; about 40 vol. % to about 90 vol. %, about 50 vol. % to about 90 vol. %, about 60 vol. % to about 90 vol. %, about 70 vol. % to about 90 vol. %, about 80 vol. % to about 90 vol. %; about 30 vol. % to about 80 vol. %; about 40 vol. % to about 80 vol. %, about 50 vol. % to about 80 vol. %, about 60 vol. % to about 80 vol. %, about 70 vol. % to about 80 vol. %; about 30 vol. % to about 70 vol. %; about 40 vol. % to about 70 vol. %, about 50 vol. % to about 70 vol. %, about 60 vol. % to about 70 vol. %; about 30 vol. % to about 60 vol. %; about 40 vol. % to about 60 vol. %, or about 50 vol. % to about 60 vol. %, including any ranges or subranges therebetween, as measured by difference in the total amount/volume of oxidized nitrogen species in the reactor outlet stream and the amount/volume of total oxidized nitrogen species in the gas stream leaving the absorber (e.g., the first absorber). In some cases, any of the foregoing conversions of oxidized nitrogen species is obtained using a plurality of absorbers, as measured by the difference in the total volume/amount of oxidized nitrogen species in the reactor outlet stream and the volume/amount of total oxidized nitrogen species in the gas stream leaving the last absorber (e.g., the most downstream absorber). The compounds traversing through the liquid phase form the gas phase produced by absorber 7.

The liquid phase of absorber 7 absorbs at least a portion of the nitrates, nitrites, nitric acid, salts thereof, or a mixture thereof. The liquid phase may comprise a basic compound, such as those chosen from calcium carbonate, sodium hydroxide, potassium hydroxide, and a mixture thereof. In certain embodiments, the absorber 7 produces a salt from the nitric compounds by containing a basic compound in the liquid phase. Additionally or alternatively, the liquid phase may comprise an acidic compound including, e.g., nitric acid, phosphoric acid, or sulfuric acid. For example, the liquid phase may contain an acidic compound, such that the liquid phase has a pH of about 0 to about 7, about 2 to about 7, about 3 to about 7, about 4 to about 7, about 4 to about 6.5., about 5 to about 6.5, or any ranges or subranges thereof. In some cases, liquid phase may comprise an oxidizing compounds, such as hydrogen peroxide and/or ozone. For example, the liquid phase may include one or more oxidizing compounds to oxidize one or more nitrogen compounds in the liquid phase. Peroxide can promote the oxidization of nitrites to nitrates. Additionally or alternatively, hydrogen peroxide may promote react with nitrous acid to produce nitric acid and water in the liquid phase. Hydrogen peroxide in water may also increase the ability to capture NO and/or $NO_2$ by oxidation and accelerating the cascade toward nitrates. Ozone may increase the rate of conversion of NO to $NO_2$ in the gas phase ($NO_2$ is more rapidly absorbed by an aqueous liquid phase than NO). For example, ozone may react with NO to produce $NO_2$ and $O_2$. In some embodiments, the liquid phase may comprise a catalyst. The catalyst may comprise platinum, palladium, hafnium, molybdenum, tungsten, zirconium, or a mixture thereof. For example, the catalyst may include $WO_3$, $MoO_3$, $ZrO_2$, $HfO_2$, or combinations thereof.

The absorber 7 may have an upper portion configured for the collection of the gas phase and/or for fluidic connection to recycle conduit 15. For instance, gas transported or produced in the absorber collects at the top of the absorber. In at least one embodiment, absorber 7 has a port traversing through the top or a top portion of absorber 7 and fluidically coupled to recycle conduit 15.

Recycle conduit 15 is fluidically coupled to absorber 7 and inlet conduit 8. Recycle conduit 15 is configured to receive the gas-phase stream from absorber 7 and provide the gas-phase stream to inlet conduit 8 and subsequently the plasma reactor 1. The gas-phase stream may comprise $N_2$, $O_2$, NO, $NO_2$, $N_2O_4$, $N_2O$, $HNO_3$, $HNO_2$, and other nitrogen oxides. The amount of oxidized nitrogen species in the gas-phase stream may be about 0.1 to about 80 vol. %, about 0.1 to about 70 vol. %, about 0.1 to about 60 vol. %, about 0.1 to about 50 vol. %, about 0.1 to about 40 vol. %, about 0.1 to about 30 vol. %, about 0.1 to about 20 vol. %, about 0.1 to about 10 vol. %; about 5 to about 80 vol. %, about 5 to about 70 vol. %, about 5 to about 60 vol. %, about 5 to about 50 vol. %, about 5 to about 40 vol. %, about 5 to about 30 vol. %, about 5 to about 20 vol. %, about 5 to about 10 vol. %; about 10 to about 80 vol. %, about 10 to about 70 vol. %, about 10 to about 60 vol. %, about 10 to about 50 vol. %, about 10 to about 40 vol. %, about 10 to about 30 vol. %, or about 10 to about 20 vol. %, including ranges and subranges therebetween, based on the total volume/volumetric flow rate of the gas stream.

Recycle conduit 15 may have a structure and be formed of a material that is suitable for receiving and containing the gas-phase stream. For example, recycle conduit 15 may be a pipe, tube, or the like formed of a material, such as a metal, metal alloy, plastic, ceramic, or the like. The thickness and structure of recycle conduit 15 may vary depending on the contents flowing therethrough, the pressure exerted on the conduit, and other design parameters. One of ordinary skill would have knowledge of suitable conduits for recycle conduit 15.

System 100 includes a feed conduit 17 configured for receiving a feed stream comprising molecular oxygen and molecular nitrogen. Feed conduit 17 may be fluidically coupled to inlet conduit 8, such that a feed stream may flow through feed conduit 17, e.g., from feed gas supply device 9, to inlet conduit 8. Feed conduit 17 may have a structure and be formed of a material that is suitable for receiving and/or containing the feed stream. For example, feed conduit 17 may be a pipe, tube, or the like formed of a material, such as a metal, metal alloy, plastic, ceramic, or the like. The thickness and structure of feed conduit 17 may depend on the contents flowing therethrough, the pressure exerted on the conduit, and other design parameters. One of ordinary skill would have knowledge of suitable conduits for feed conduit 17.

System 100 may include a feed-gas-supply device 9 configured to produce a feed stream or a component thereof. For example, feed-gas-supply device may provide a portion of or all of the feed stream to feed conduit 17. Feed-gas-supply device 9 may be configured to provide air, or components thereof. For example, feed-gas-supply device 9 may provide a feed stream or a portion thereof, such that the feed stream has a weight ratio of molecular oxygen to molecular nitrogen of about 1:5 to about 5:1. In some embodiments, the feed stream has a weight ratio of molecular oxygen to molecular nitrogen of about 1:5 to about 5:1, about 1:5 to about 4:1, about 1:5 to about 3:1, about 1:5 to about 2:1; about 1:1 to about 5:1, about 1:1 to about 4:1, about 1:1 to about 3:1, about 1:1 to about 2:1; about 1.5:1 to about 5:1, about 1.5:1 to about 4:1, about 1.5:1 to about 3:1, about 1.5:1 to about 2:1; about 2:1 to about 5:1, about 2:1 to about 4:1, about 2:1 to about 3:1; about 3:1 to about 5:1, about 3.5:1 to about 4.5:1, or any range or subrange therebetween, during use. Feed gas supply device 9 may be an air separator chosen from a zeolite pump, a pressure-swing absorber, a membrane-based separator, a cryogenic air separator, an air filtration unit, a gas columnated separator, or an oxygen concentrator, a compressor, a blower, or a combination thereof. The feed gas supply device may be an air separator configured to separate atmospheric air to provide certain compounds, such as molecular nitrogen, molecular oxygen, in a predetermined weight ratio. In at least one embodiment, the feed gas supply device may produce ozone, such that the feed stream contains ozone. The amount of ozone produced by the feed gas supply device may be about 1 to about 30 vol. %, about 1 to about 20 vol. %, about 1 to about 10 vol. %, about 1 to about 5 vol. %, based on the total volume of the feed stream.

Preferably, system 100 includes a pump, a blower and/or a compressor for pressurizing and moving the contents of the stream, e.g., through one or more conduits. One of ordinary skill would readily be able to size and/or determiner suitable blower(s), pump(s) and/or compressors(s) based on the implemented system and/or method.

System 100 may include one or more of blower(s), compressor(s) and/or pump(s) 16 fluidically coupled to recycle conduit 15, wherein feed conduit 17 is located downstream of the one or more of a blower and a compressor 16. Although system 100 is illustrated in FIG. 1 as having a compressor 16 coupled to recycle conduit 15 and feed conduit 17 located downstream from such compressor 16, in other embodiments one or more compressor(s) and/or pump(s) may fluidically be coupled to the recycle conduit and located downstream of the feed conduit. FIG. 3 illustrates system 300, which includes one or more compressor(s) and/or pump(s) fluidically coupled to reactor outlet conduit 5, downstream from plasma reactor 1 and upstream from absorber 7.

A product outlet conduit may be fluidically coupled to absorber 7 and configured to receive the liquid phase from absorber 7. As noted above, liquid phase 7 comprises at least a portion of the nitrates, nitrites, nitric acid, salts thereof, or a mixture thereof. As illustrated in FIG. 1, product outlet conduit 14 may include a valve to enable the liquid phase to removed as batches or as a continuous stream. Product outlet conduit 14 may have a structure and be formed of a material that is suitable for receiving and/or containing the product stream. For example, product outlet conduit 14 may be a pipe, tube, or the like formed of a material, such as a metal, metal alloy, plastic, ceramic, or the like. The thickness and structure of the product outlet conduit 14 may depend on the contents flowing therethrough, the pressure exerted on the conduit, and other design parameters. One of ordinary skill would have knowledge of suitable conduits for product outlet conduit 14.

System 100 may include a purge conduit 12 configured to receive a purge stream. Purge conduit 12 may be fluidically coupled to recycle conduit 15, such that the purge stream has the composition of the gas phase produced by absorber 7. Purge conduit 12 may be coupled to a purge chamber that is configured to receive and store the purge stream. Although purge conduit 12 is fluidically coupled to recycle conduit 15 in FIG. 1, in some embodiments purge conduit 12 is fluidically coupled to inlet conduit 8 or reactor outlet conduit 5. Purge conduit 12 may have a structure and be formed of a material that is suitable for receiving and containing a purge stream. For example, purge conduit 12 may be a pipe, tube, or the like formed of a material, such as a metal, metal alloy, plastic, ceramic, or the like. The thickness and structure of purge conduit 12 may depend on the contents flowing therethrough, the pressure exerted on the conduit, and other design parameters. One of ordinary skill would have knowledge of suitable conduits for purge conduit 12.

Valves, such as one-way values, may be included in system 100 to facilitate flow direction, for purging system 100, for collecting nitrogen compounds from absorber 7, etc. For example, one-way valves may be fluidically coupled to conduits of system 100 to ensure that the stream in the respective conduit flows in the direction that the conduit is configured for. Additionally, the plasma reactor 1 and/or absorber 7 may have ports outfitted with check valves or other means to prevent undesired backflow. In some cases, plasma reactor 1 and/or absorber 7 may have valves and/or ports for solid-form inputs.

System 100 may utilize one more sensors. For example, system 100 may have toroidal conductivity sensors configured for detecting the production of product the absorber 7 and/or neutralization chamber 32. Non-limiting examples of sensors that may be used include dynamic light scattering, viscometers, molecular weight, pressure, temperature, refractometer, optical fiber sensors, and the like.

The system or a unit/component thereof (e.g., plasma reactor 1 or absorber 7) may operate at a pressure of about 10 psi to about −10 psi. For example, the system or a unit/component thereof may operate a pressure of about 10 psi to about −10 psi, about 9 psi to about −10 psi; about 8 psi to about −10 psi, about 7 psi to about −10 psi, about 6 psi to about −10 psi, about 5 psi to about −10 psi, about 4 psi to about −10 psi, about 3 psi to about −10 psi, about 2 psi to about −10 psi, about 1 psi to about −10 psi; about 10 psi to about −8 psi, about 9 psi to about −8 psi; about 8 psi to about −8 psi, about 7 psi to about −8 psi, about 6 psi to about −8 psi, about 5 psi to about −8 psi, about 4 psi to about −8 psi, about 3 psi to about −8 psi, about 2 psi to about −8 psi, about 1 psi to about −8 psi; about 10 psi to about −6 psi, about 9 psi to about −6 psi; about 8 psi to about −6 psi, about 7 psi to about −6 psi, about 6 psi to about −6 psi, about 5 psi to about −6 psi, about 4 psi to about −6 psi, about 3 psi to about −6 psi, about 2 psi to about −6 psi, about 1 psi to about −6 psi; about 10 psi to about −4 psi, about 9 psi to about −4 psi; about 8 psi to about −4 psi, about 7 psi to about −4 psi, about 6 psi to about −4 psi, about 5 psi to about −4 psi, about 4 psi to about −4 psi, about 3 psi to about −4 psi, about 2 psi to about −4 psi, about 1 psi to about −4 psi; about 10 psi to about −2 psi, about 9 psi to about −2 psi; about 8 psi to about −2 psi, about 7 psi to about −2 psi, about 6 psi to about −2 psi, about 5 psi to about −2 psi, about 4 psi to about −2 psi, about 3 psi to about −2 psi, about 2 psi to about −2 psi, about 1 psi to about −2 psi; about 10 psi to about −1 psi, about 9 psi to about −1 psi; about 8 psi to about −1 psi, about 7 psi to about −1 psi, about 6 psi to about −1 psi, about 5 psi to about −1 psi, about 4 psi to about −1 psi, about 3 psi to about −1 psi, about 2 psi to about −1 psi, about 1 psi to about −1 psi, including ranges and subranges therebetween.

Figure 2:
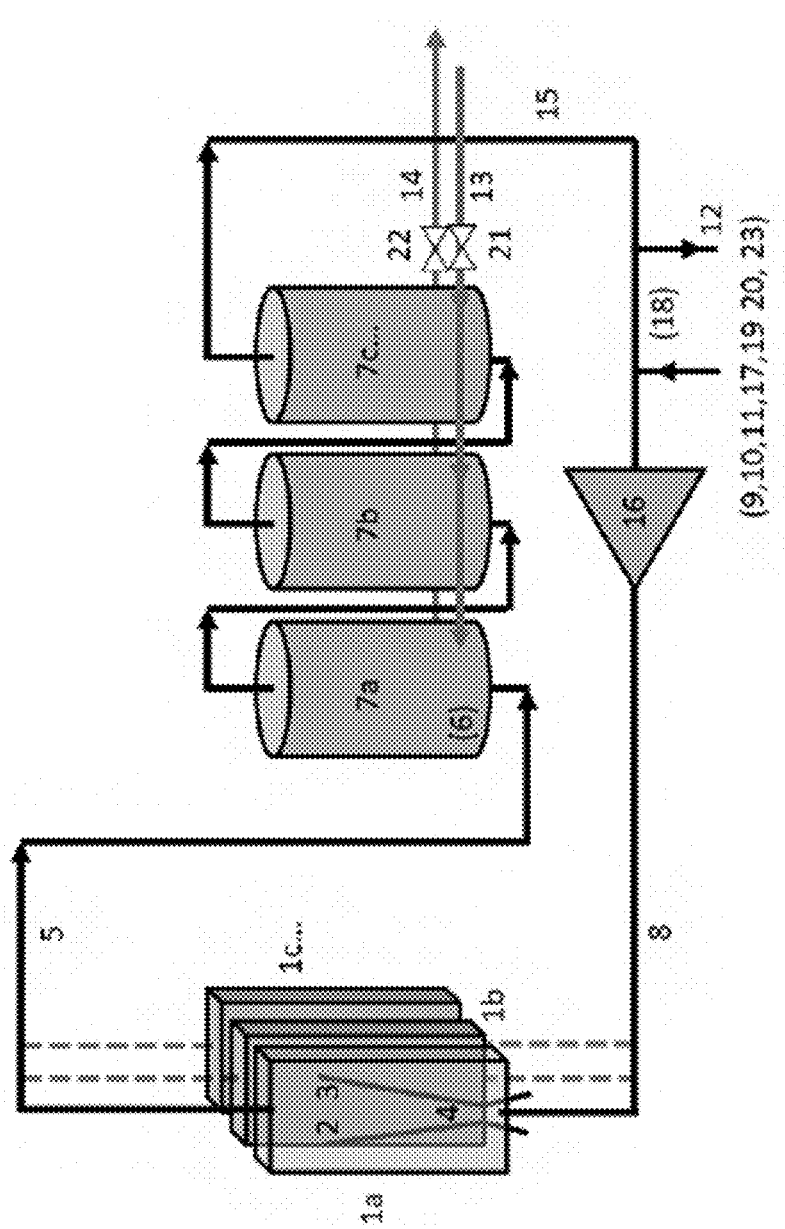
FIG. 2 illustrates another non-limiting, exemplary system, which uses a plurality of plasma reactors and a plurality of absorbers, for producing nitrogen compounds according to aspects of the disclosure.

With reference to FIG. 2, shown is another system 200 configured for producing nitrogen compounds. System 200 is similar system 100, but includes a plurality of plasma reactors, a plurality of absorbers, and port locations for coupling to conduits that differ from those shown for system 100. Accordingly, where system 200 utilizes components, features, and/or elements that are similar to those of system 100, similar reference numerals are applied. It should be understood that although similar reference numerals are utilized, various aspects of the features of system 200, e.g., size, material, etc. may be different from those described with respect to system 100.

System 200 includes a plurality of plasma reactors 1*a*-1*c*. Although plurality of plasma reactors 1*a*-1*c* illustrated in FIG. 2 are arrange in parallel, in certain embodiments the plurality of plasma reactors may be arranged in series or in a combination of parallel and series. Plurality of reactors 1a-1c may each be coupled to a reactor outlet conduit that are coupled to each other, such that the reactor outlet streams from each of the plurality of reactors 1a-1c are combined before reaching the plurality of absorbers 7a-7c. In some embodiments, however, the plurality of plasma reactors 1a-1c may each be coupled to a separate reactor outlet conduit 5 that is fluidically coupled to the plurality of absorbers 7a-7c.

As illustrated in FIG. 2, system 200 includes a plurality of absorbers 7a-7c that are arranged in series with respect to each other. Arranging the plurality of absorbers 7a-7c in series provides the benefit of an increased absorption of the nitrogen compounds as a weight percent of the reactor outlet stream as compared to arranging the plurality of absorber 7a-7c in parallel. For example, arranging the plurality of absorbers 7a-7c in series may provide an enhanced absorption of the nitrogen compounds and thus provide a gas phase stream produced by the last absorber 7c that has a lower amount of nitrogen compounds as a weight percentage compared to arranging the absorbers in parallel. In some embodiments, the plurality of absorbers 7a-7c are arranged in parallel to each other. Arranging the plurality of absorbs in parallel may enable increased volumetric flow through the plurality of absorbers 7a-7c and may result in less of a pressure drop than arranging the plurality of absorbers in series. The first absorber 7a of the plurality of absorbers 7a-7c has a port, e.g., extending through the wall of a bottom and/or lower section of first absorber 7a, that is fluidically coupled to reactor outlet conduit 5, such that reactor outlet stream may be received in a lower portion of first absorber 7a. First absorber 7a may have a port, e.g., extending through the wall of the top and/or upper portion of first absorber 7a, that is fluidically coupled to a gas outlet conduit 39a.

Gas outlet conduit 39a may receive the gas phase from first absorber 7a and provide such gas phase to second absorber 7b. Gas outlet conduit 39a is configured to receive the gas phase stream from the first absorber 7a. Gas outlet conduit 39a is fluidically coupled to a second absorber 7b, such that the gas phase stream produced by absorber 7a flows through gas outlet conduit 39a to absorber 7b.

Second absorber 7b may have a port, e.g., extending through the wall of the bottom or lower portion of second absorber 7b, that is fluidically coupled to gas outlet conduit 39a, such that the gas phase stream produced by first absorber 7a is received in a lower portion of second absorber 7b. Second absorber 7b may have a port, e.g., extending through the wall of the top and/or upper portion of second absorber 7b, that is fluidically coupled to a gas outlet conduit B.

Gas outlet conduit 39b may receive the gas phase from the second absorber 7b and provide such gas phase to third absorber 7c. Gas outlet conduit 39b is configured to receive the gas phase stream from the second absorber 7b. Gas outlet conduit 39b is fluidically coupled to a third absorber 7c, such that the gas phase stream produced by absorber 7b flows through gas outlet conduit 39b to third absorber 7c.

Third absorber 7c may have a port, e.g., extending through the wall of the bottom and/or a lower portion of third absorber 7c, that is fluidically coupled to gas outlet conduit B, such that the gas phase stream produced by second absorber 7b is received in a lower portion of third absorber 7c. Third absorber 7c may have a port, e.g., extending through the wall of the top and/or upper portion of third absorber 7c, that is fluidically coupled to recycle conduit 15.

Recycle conduit 15 may receive the gas phase from third absorber 7c and provide the gas phase to an inlet conduit that is fluidically coupled to the plasma reactor, such that at least a portion of gas phase flow from third absorber 7c to plasma reactor 1. As illustrated in FIG. 2, recycle conduit 15 may be fluidically coupled to a purge conduit 12 configured for allowing at least a portion of the recycle stream to be purged from system 200. Although purge conduit 12 is fluidically coupled to recycle conduit 15 upstream from feed conduit 17 and/or compressor 16 in FIG. 2, purge conduit 12 may be fluidically coupled to inlet conduit 8 and/or be located downstream of compressor 16 and/or feed conduit 17.

Gas outlet conduits 39a and 39b may have a structure and be formed of a material that is suitable for receiving a containing the gas phase produced by absorbers 7a and 7b, respectively. Gas outlet conduit 39a and 39b may be a pipe, tube, or the like formed of a material, such as a metal, metal alloy, plastic, ceramic, or the like. The thickness and structure of gas outlet conduits 39a and 39b may depend on the contents flowing therethrough, the pressure exerted on the conduit, and other design parameters. One of ordinary skill would have knowledge of suitable conduits for gas outlet conduits 39a and 39b.

Figure 4:
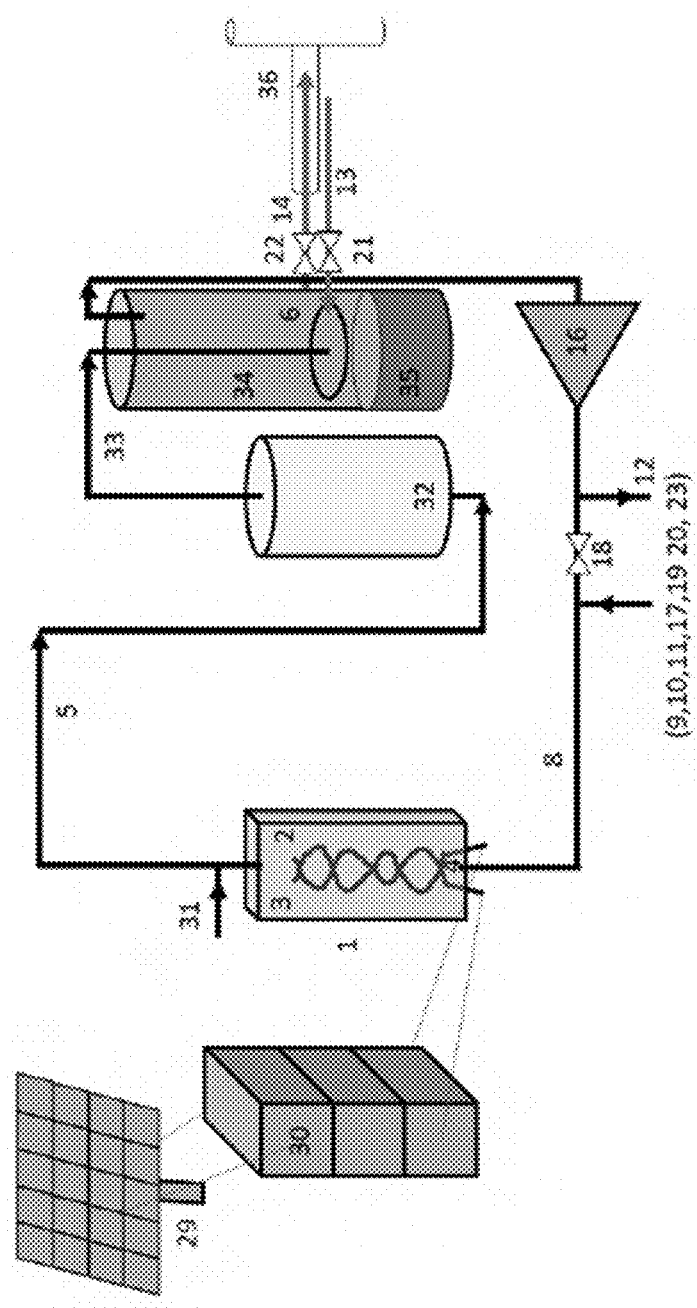
FIG. 4 illustrates yet a further non-limiting, exemplary system using a gas-oxidation chamber and a neutralization unit for producing nitrogen compounds according to aspects of the disclosure.

With reference to FIG. 4, shown is another system 400 configured for producing nitrogen compounds and that is powered from a solar array. System 400 is similar systems 100 and 200, but includes a second feed conduit 31, a gas oxidation chamber 32, a neutralization unit 36, and a solar array. Accordingly, where system 400 utilizes components that are similar to those of systems 100 and/or 200, similar reference numerals are applied. It should be understood that although similar reference numerals are utilized, various aspects of the features of system 400, e.g., size, material, etc. may be different from those described with respect to systems 100 and/or 200.

As illustrated in FIG. 4, system 400 is powered by electricity obtained from a green source, such as a solar panel 29 and/or a battery charged by the solar panels. Solar panel 29 and/or the battery may be coupled to power condition equipment 30 to provide the appropriate voltage, current, pulse rate and/or frequency of power for plasma generation. In one specific example, the solar array charges the battery, and power is drawn from the batteries.

System 400 may be powered by a green source, such as solar panel, wind turbine, geothermal, hydroelectric, tidal, etc. In one specific embodiment, system 400 is powered by a power source that is geographically local, e.g., within 20 miles, within 10 miles, within 5 miles, or within 1 mile, to system 400.

System 400 includes a second feed conduit 31 configured for receiving a first and a second feed stream comprising molecular oxygen and molecular nitrogen. A second feed stream may be used to change the gas composition, temperature, and/or pressure after the reactor. For example, the oxygen content may be increased and/or ozone added using the second feed stream to encourage oxidation of NO to $NO_2$ before reaching the absorbers. Second feed conduit 31 may be fluidically coupled to reactor outlet conduit 5, such that a reactor outlet stream may comprise the feed stream received by second feed conduit 31. Second feed conduit 31 may have a structure and be formed of a material that is suitable for receiving the feed stream. Second feed conduit 31 may be coupled to one or more feed gas supply device(s) 9.

System 400 includes a gas oxidation chamber 32 configured for oxidizing nitrogen compounds produced by plasma reactor 1. Oxidation chamber 32 may provide a volume of gas and dwell time for the oxidation of NO to $NO_2$ before subsequent absorption of $NO_2$ to form nitrates. This reaction may be accelerated by a catalyst surface, increased oxygen, ozone in the oxidation chamber. The oxidation chamber may comprise a reaction volume to enhance the oxidation of nitrogen species with oxygen, ozone, or heterogeneous catalysis.

A neutralization unit 36 may be fluidically coupled to absorber for neutralizing nitric acid. Neutralization unit 36 may be configured to produce fertilizer products by neutralizing nitric acid. Neutralization unit 36 may contain neutralization agent, such as calcium nitrate, potassium nitrate, sodium nitrate, other nitrates, nitrophosphates, ammonium nitrate, among other nitrate-based compounds. The nitrogen compounds may be sold as fixed nitrogen or fertilizer products beyond nitric acid. By using separate absorber(s) 7 from the neutralization unit 36, the production of nitrogen compounds and/or fertilizers can completed using batch-mode conversion of nitric acid. Neutralizing unit 36 may contain a neutralization agent which may include a basic compound, such as CaCO3, Ca(OH)2, KOH, K2CO3, lime, potash, sodium salts, rock phosphate, and other salts or minerals which may be used to neutralize nitric acid. Neutralizing unit 36 may be coupled to a conduit for providing a neutralization agent to neutralizing unit 36. The conduit coupled to neutralizing unit 36 may be configured for receiving solid, liquid, or gaseous neutralization agents. In certain embodiments, product output (e.g., the produced nitrogen compounds or a stream thereof) may be released into an application or storage feed which may include drip irrigation, a central pivot system, a storage tank, or another processing device.

Figure 5:
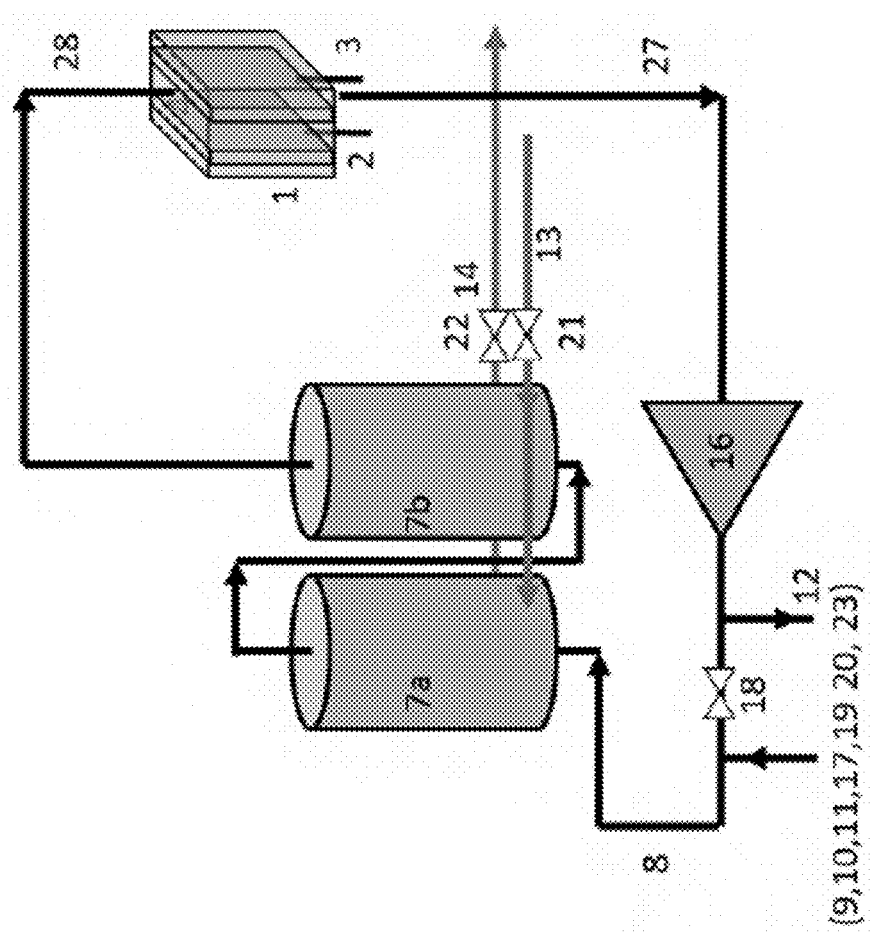
FIG. 5 illustrates yet an additional non-limiting, exemplary system having a feed conduit and a purge conduit arranged in certain locations with respect to the absorber and plasma reactor in accordance with aspects of the disclosure.

With reference to FIG. 5, shown is another system 500 configured for producing nitrogen compounds. System 500 is similar system 100, but includes a feed conduit and a purge conduit arranged in a different location with respect to absorber(s) 7 and plasma reactor 1. As illustrated in FIG. 5, system 500 provides two pressure change mechanisms and is configured such that plasma reactor 1 is on the low pressure side of compressor 16 so that plasma may be produced at a vacuum pressure. Accordingly, where system 500 utilizes components that are similar to those of system 100, similar reference numerals are applied. It should be understood that although similar reference numerals are utilized, various aspects of the features of system 500, e.g., size, material, etc. may be different from those described with respect to system 100. System 500 may operate under a lower pressure than that of system 100.

Figure 9A:
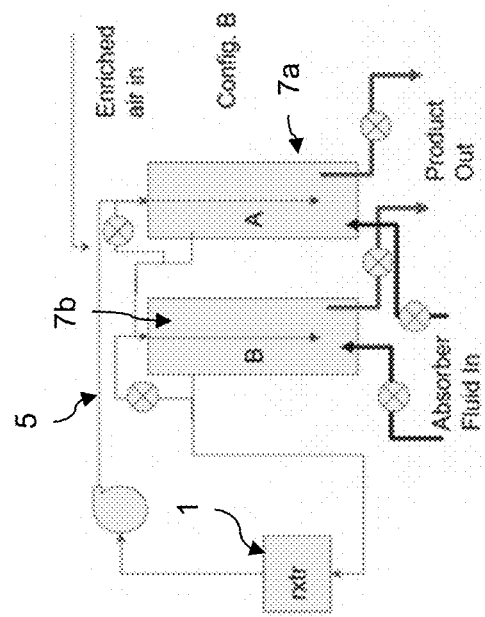
FIGS. 9A and 9B illustrate yet further non-limiting, exemplary systems for producing nitrogen compounds according to aspects of the disclosure.
Figure 9B:
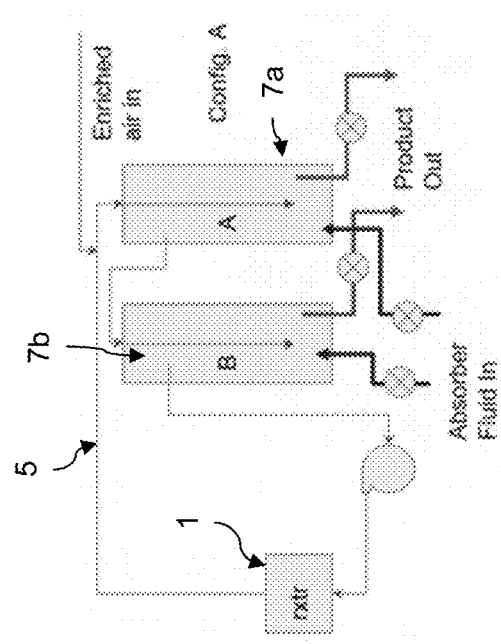

As mentioned above, system 500 includes a plasma reactor that arranged upstream from compressor 16 (e.g., low pressure side of compressor 16), such that plasma may be produced at a vacuum pressure. More specifically, as illustrated in FIG. 5, compressor 16 is pumping against the liquid in the absorber columns, creating a low pressure region in this case. Additionally, oxidized nitrogen species are consumed in the absorber, decreasing pressure over time. For instance, an ambient feed gas on the high pressure side of compressor 16 may result in gas entering system 500 after the high pressure side of compressor 16 conduit has dropped below the gas feed pressure. This may produce an intrinsic pressure control for achieving low pressure in the whole system 500. Conversely, higher intrinsic pressures may be achieved by the arrangement system 200. In at least one embodiment, the purge conduit is placed such that a gas system purge can be accomplished with respect to the feed location. With reference to FIGS. 9A and 9B, arranging the compressor 16 upstream or downstream of plasma reactor 1 yields different pressures at plasma reactor 1 and absorbers 7a and 7b. Table 1, provided below, shows an example of the operating pressures of plasma reactor 1 and absorbers 7a and 7b under the same volumetric flows and temperature.

TABLE 1

|  | Reactor | Into B | Into A |
| --- | --- | --- | --- |
| Config A | 2 psi | −5 in Hg | 0 psi |
| Config B | −8 inHg | | |

Figure 8:
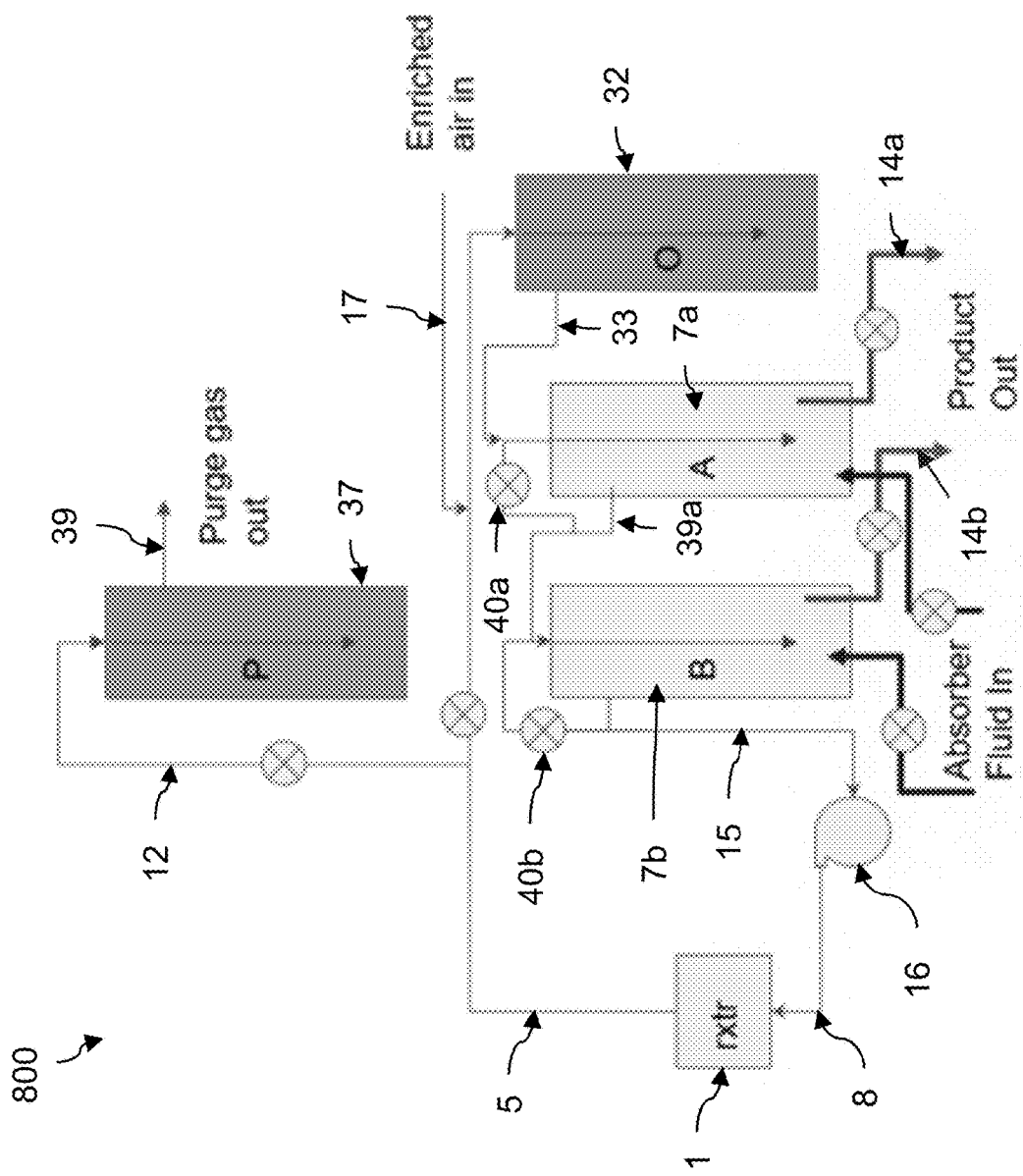
FIG. 8 illustrates another non-limiting, exemplary system for producing nitrogen compounds in accordance with aspects of the disclosure.

With reference to FIG. 8, shown is another system 800 configured for producing nitrogen compounds. System 800 is similar to systems 100-500, but includes a second feed conduit 31, a gas oxidation chamber 32, a neutralization unit 36, and a solar array. Accordingly, where system 800 utilizes components that are similar to those of systems 100-500, similar reference numerals are applied. It should be understood that although similar reference numerals are utilized, various aspects of the features of system 800, e.g., size, material, etc. may be different from those described with respect to systems 100-500.

System 800 includes a purge chamber 37 fluidically coupled to purge conduit 12 and configured to receive a purge stream from purge conduit 12. The purge chamber 37 is preferably configured to produce a gas release stream by converting or removing oxidized nitrogen species, e.g., NOx, from the purge stream. For example, purge chamber 37 may comprise a catalyst for converting oxidized nitrogen species. The catalyst may be platinum, palladium, hafnium, molybdenum, tungsten, zirconium, or a mixture thereof, such as those chosen from $WO_3$, $MoO_3$, $ZrO_2$, $HfO_2$, and a mixture thereof. Additional or alternatively, purge chamber may utilize ozone or peroxide to further oxidize the oxidized nitrogen species. Purge chamber 37 may be a catalytic converter, a scrubber, or the like.

Preferably, about 50 wt. % or more of the oxidized nitrogen species in the purge stream are converted and/or removed by purge chamber 37, based on the total volume of oxidized nitrogen species in the purge stream. For example, the purge chamber 37 removes and/or converts about 50 vol. % to about 90 vol. %, about 60 vol. % to about 90 vol. %, about 70 vol. % to about 90 vol. %, about 80 vol. % to about 90 vol. % of the oxidized nitrogen species, based on the total volume of total volume of oxidized nitrogen species in the purge stream.

Purge chamber 37 is fluidically coupled to gas release conduit 39 that is configured for receive the gas release stream. Gas release stream preferably contains minimal greenhouse gasses (e.g., oxidized nitrogen species). For example, the gas release stream can contain less than 5 vol. %, less than 4 vol. %, less than 3 vol. %, less than 2 vol. %, or less than 1 vol. % of the oxidized nitrogen species.

System 800 includes an oxidative chamber 32 that is fluidically coupled to reactor outlet conduit 5 and configured for receive the reactor outlet stream from plasma reactor 1. Oxidative chamber 32 is configured to oxidize the oxidized nitrogen species. For example, oxidative chamber 32 may comprise ozone, oxygen, peroxides, or other oxidizing agents. Oxidative chamber 32 may comprise a catalyst for converting oxidized nitrogen species. The catalyst may be platinum, palladium, hafnium, molybdenum, tungsten, zirconium, or a mixture thereof. In some embodiments, the catalyst comprises $WO_3$, $MoO_3$, $ZrO_2$, $HfO_2$, or mixtures thereof.

Preferably, oxidative chamber 32 provides a dwell time of the gas therein of about 1 second (sec) to about 30 minutes (mins). In some cases, oxidative chamber 32 may be configured to provide an average dwell time to gas therein of about 1 sec to about 30 mins, about 15 secs to about 30 mins, about 30 secs to about 30 mins, about 45 secs to about 30 mins, about 1 min to about 30 mins; about 1 sec to about 20 mins, about 15 secs to about 20 mins, about 30 secs to about 20 mins, about 45 secs to about 20 mins, about 1 min to about 20 mins; about 1 sec to about 15 mins, about 15 secs to about 15 mins, about 30 secs to about 15 mins, about 45 secs to about 15 mins, about 1 min to about 15 mins; about 1 sec to about 10 mins, about 15 secs to about 30 mins, about 10 secs to about 10 mins, about 45 secs to about 10 mins, about 1 min to about 10 mins; about 1 sec to about 5 mins, about 15 secs to about 5 mins, about 30 secs to about 5 mins, about 45 secs to about 5 mins, about 1 min to about 5 mins; about 1 sec to about 3 mins, about 15 secs to about 3 mins, about 30 secs to about 3 mins, about 45 secs to about 3 mins, about 1 min to about 3 mins, or any ranges or subranges thereof.

Oxidative chamber 32 is fluidically coupled to oxidative chamber outlet conduit 33. Oxidative chamber outlet conduit 33 is configured to receive the gas stream from oxidative chamber 32 and provide the gas stream to absorber 7. Oxidative chamber outlet conduit 33 may have a structure and be formed of a material that is suitable for receiving and/or containing the oxidized nitrogen species. For example, oxidative chamber outlet conduit 33 may be a pipe, tube, or the like formed of a material, such as a metal, metal alloy, plastic, ceramic, or the like. The thickness and structure of the oxidative chamber outlet conduit 33 may depend on the contents flowing therethrough, the pressure exerted on the conduit, and other design parameters. One of ordinary skill would have knowledge of suitable conduits for oxidative chamber outlet conduit 33.

Absorbers 7a and 7b of system 800 are fluidically coupled to bypass valves 40a and 4b, respectively. Bypass valves 40a and 40b may be configured for reducing a pressure drop across absorber 7a and 7b, respectively. For instance, bypass valves 40a and 40b may be configured to permit or prevent the pressure across absorber 7a and 7b, respectively, from equilibrating. In a more specific example, bypass valves 40a and 40b may be opened to permit gas to flow from upstream of absorber 7a and 7b, respectively to downstream of the absorber 7a and 7b, respectively, without passing through the respective absorber 7a or 7b, thereby equilibrating the pressure difference directly upstream and directly downstream of the respective absorber 7a and 7b.

Figure 6:
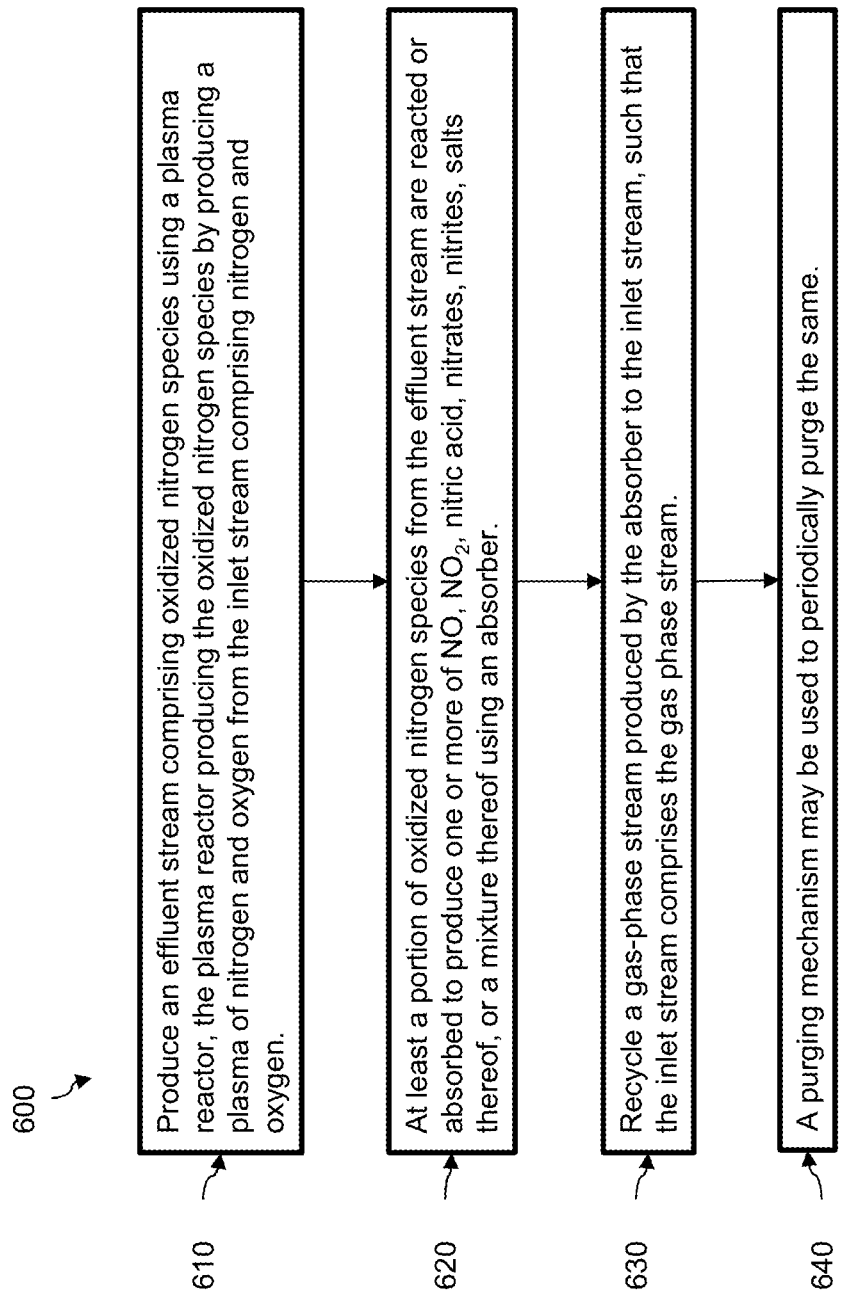
FIG. 6 illustrates an exemplary, non-limiting method for producing nitrogen compounds in accordance with aspects of the disclosure.

According to another aspect of the disclosure, provided is a method for producing nitrogen compounds, as shown in FIG. 6. As a general overview, method 600 includes producing a effluent stream from an inlet stream using a plasma reactor in step 610; producing nitrates, nitrites, salts thereof, or a mixture thereof from the effluent stream using an absorber in step 620; recycling the gas phase stream produced by the absorber to the inlet stream in step 630; and using a purge mechanism to purge the system. Method 600 may utilize any of the systems, components thereof, and/or features/elements thereof described above with respect to systems 100, 200, 300, 400, 500, and/or 800.

In step 610, an effluent stream comprising nitric acid, oxidized nitrogen species, or a mixture thereof is produced from an inlet stream comprising nitrogen and oxygen using a plasma reactor. The effluent stream produced in step 610 may include any of the compounds, components, or features discussed above with respect to reactor outlet conduit 5 and/or reactor outlet stream. For instance, the effluent stream may comprise one or more oxidized nitrogen species, such as NO, $NO_2$, $N_2O_4$, $N_2O$, $HNO_2$, $HNO_3$, $N_2O_5$, $N_2O_5$, HNO, $HNO_2$, $HNO_3$, or a mixture thereof. The nitric acid, oxidized nitrogen species, salts thereof, or a mixture thereof is preferably produced using a plasma of nitrogen and oxygen from the inlet stream. In some instances, the plasma of nitrogen and oxygen is produced as non-thermal plasma of nitrogen and oxygen.

In step 620, nitrates, nitrites, salts thereof, or a mixture thereof are produced from the effluent stream using an absorber. The effluent stream may be dispersed through the absorber optionally using a diffuser to increase the contact between the effluent stream and a liquid phase contained in the absorber. For example, in certain embodiments using a bubble absorber, the effluent stream is diffused and/or dispersed through the liquid phase using a diffuser submerged in the liquid phase. In other embodiments, the effluent stream is diffused and/or dispersed through the liquid phase using trays, e.g., in a plate absorption column. In yet further embodiments, the effluent stream is diffused and/or dispersed through the liquid phase using random packing material or structured packing material, e.g., in a packed column.

Preferably, components of the effluent stream, such as the oxidized nitrogen species, are oxidized by diffusing through the liquid phase. In some instances, the absorber converts at least 50%, by volume, of the oxidized nitrogen species in the effluent stream. For example, in some cases, about 55 vol. % or more, about 60 vol. % or more, about 65 vol. % or more, about 70 vol. % or more, about 75 vol. % or more, about 80 vol. % or more, about 85 vol. % or more, about 90 vol. % or more, or about 95 vol. % or more, based on the amount by weight of the oxidized nitrogen species entering the absorber via the effluent stream.

At least a portion of the oxidized nitrogen species, nitrates, nitrites, nitric acid, salts thereof, or a mixture thereof may be removed from the effluent stream using an absorber, such that the absorber produces a gas phase stream and a liquid phase, wherein the liquid phase comprises the removed portion of the oxidized nitrogen species, nitrates, nitrites, nitro-phosphates, nitric acid, salts thereof, or a mixture thereof. The absorber may remove the at least a portion of the oxidized nitrogen species nitrates, nitrites, nitro-phosphates, nitric acid, salts thereof, or a mixture thereof from the effluent stream by bubbling the effluent stream through the liquid phase.

In certain embodiment, method 600 includes the step of adding a basic compound, an acid compound, an oxidizing compound, and/or a catalyst to the liquid phase of the absorber. The liquid phase may include a basic compound, such as those chosen from calcium carbonate, sodium hydroxide, potassium hydroxide, and a mixture thereof. The basic compound maybe calcium nitrate, potassium nitrate, sodium nitrate, other nitrates, nitrophosphates, ammonium nitrate, among other nitrate-based compounds. In at least one embodiment, the basic compound comprises CaCO3, Ca(OH)2, KOH, K2CO3, lime, potash, sodium salts, rock phosphate, and/or other salts or minerals that may be used to neutralize nitric acid.

In some instances, the liquid phase of the absorber includes a catalyst comprising platinum, palladium, hafnium, molybdenum, tungsten, zirconium, or a mixture thereof. For example, the liquid phase may include a catalyst comprising WO₃, MoO₃, ZrO₂, HfO₂, or a mixture thereof. In one specific embodiment, the liquid phase of the absorber 27 contains a catalyst comprising of platinum, palladium, rhodium, alumina, molybdenum, oxides thereof, or a mixture thereof.

In step 630, the gas phase stream produced by the absorber is recycled to the inlet stream, such that the inlet stream comprises the gas phase stream. By recycling the gas phase stream produced by the absorber to the plasma reactor, method 600 surprisingly increases the efficiency of producing the nitrogen compound products. For example, method 600 and/or a system utilizing method 600 may achieve up to 90% increased energy efficiency.

In step 640, a purge mechanism may be used to purge the system. Preferably, step 640 restores the stream composition (e.g., the inlet stream, the effluent stream, the gas stream, and/or the recycle stream) to have a desired and/or predetermined composition. The desired and/or predetermined composition may include the stream composition e.g., the inlet stream, the effluent stream, the gas stream, and/or the recycle stream) having a weight ratio of molecular oxygen to molecular nitrogen of about 1:1 to about 5:1 or about 3:2 to about 4:1.

Method 600 may include providing a feed stream using a feed gas supply device, wherein the inlet stream comprises the feed stream. The feed stream may, in some cases, have a composition of air. For instance, the feed stream may be air that feed gas supply device has pumped and/or pressurized to flow into the feed conduit of a system, such as systems 100-500. In certain embodiments, the feed stream has a composition with a weight ratio of molecular oxygen to molecular nitrogen of about 1:1 to about 5:1 or about 3:2 to about 4:1. In at least one embodiment, the feed gas supply device may produce ozone, such that the feed stream contains ozone. The amount of ozone produced by the feed gas supply device may be about 1 to about 30 vol. %, about 1 to about 20 vol. %, about 1 to about 10 vol. %, about 1 to about 5 vol. %, based on the total volume of the feed stream.

Figure 7:
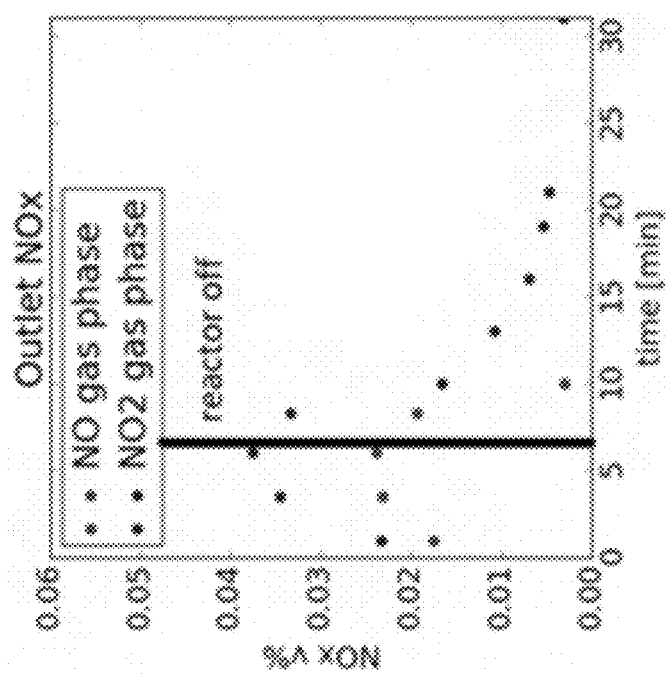
FIG. 7 illustrates a graph showing a decrease in the concentration of oxidized nitrogen species flow through an exemplary system after turning off the plasma reactor according to aspects of the disclosure.

Method 600 may include the step of turning off the plasma reactor before ending the method for producing a product of nitrogen compounds. For instance, the plasma reactor may be turned off about 1 minute or more, about 5 minutes or more, about 10 minutes or more, about 30 minutes or more, before the absorber(s), blower(s) and/or compress(s), and/or the feed gas supply device are turned off. As seen in FIG. 7, after turning the reactor off, the absorbers continue to oxidize and remove oxidized nitrogen species from the system as the remaining oxidized nitrogen species continue to circulate through the system and complete additional passes through the absorbers.

Method 600 may include pressurizing or depressurizing one or more of the plasma reactor, one or more absorbers, the effluent stream, recycle stream, the purge stream, the feed stream, the inlet stream, and/or gas phase streams between the absorbers. Any of the foregoing streams, plasma reactors, and/or absorbers may be pressurized or depressurized to a pressure of about 10 psi to about −10 psi, about 9 psi to about −10 psi; about 8 psi to about −10 psi, about 7 psi to about −10 psi, about 6 psi to about −10 psi, about 5 psi to about −10 psi, about 4 psi to about −10 psi, about 3 psi to about −10 psi, about 2 psi to about −10 psi, about 1 psi to about −10 psi; about 10 psi to about −8 psi, about 9 psi to about −8 psi; about 8 psi to about −8 psi, about 7 psi to about −8 psi, about 6 psi to about −8 psi, about 5 psi to about −8 psi, about 4 psi to about −8 psi, about 3 psi to about −8 psi, about 2 psi to about −8 psi, about 1 psi to about −8 psi; about 10 psi to about −6 psi, about 9 psi to about −6 psi; about 8 psi to about −6 psi, about 7 psi to about −6 psi, about 6 psi to about −6 psi, about 5 psi to about −6 psi, about 4 psi to about −6 psi, about 3 psi to about −6 psi, about 2 psi to about −6 psi, about 1 psi to about −6 psi; about 10 psi to about −4 psi, about 9 psi to about −4 psi; about 8 psi to about −4 psi, about 7 psi to about −4 psi, about 6 psi to about −4 psi, about 5 psi to about −4 psi, about 4 psi to about −4 psi, about 3 psi to about −4 psi, about 2 psi to about −4 psi, about 1 psi to about −4 psi; about 10 psi to about −2 psi, about 9 psi to about −2 psi; about 8 psi to about −2 psi, about 7 psi to about −2 psi, about 6 psi to about −2 psi, about 5 psi to about −2 psi, about 4 psi to about −2 psi, about 3 psi to about −2 psi, about 2 psi to about −2 psi, about 1 psi to about −2 psi; about 10 psi to about −1 psi, about 9 psi to about −1 psi; about 8 psi to about −1 psi, about 7 psi to about −1 psi, about 6 psi to about −1 psi, about 5 psi to about −1 psi, about 4 psi to about −1 psi, about 3 psi to about −1 psi, about 2 psi to about −1 psi, about 1 psi to about −1 psi, including ranges and subranges therebetween.

In at certain embodiments, method 600 produces a product stream comprising nitrogen compounds, such as NO, NO₂, nitrates, nitrites, nitric acid (HNO₃), salts thereof, or a mixture thereof while producing a minimal amount of nitrous oxide (N₂O). For example, method 600 may be able to produce product stream that contains about 10 wt. % or less of nitrous oxide based on the total weight of the nitrogen compounds in the product stream. In some embodiments, the product stream contains about 9 wt. % or less, about 8 wt. % or less, about 7 wt. % or less, about 6 wt. % or less, about 5 wt. % or less, about 4 wt. % or less, about 3 wt. % or less, about 2 wt. % or less, about 1 wt. % or less of nitrous oxide based on the total weight of the nitrogen compounds in the product stream.

The terms "comprising," "having," and "including" are used in their open, non-limiting sense. The terms "a" and "the" are understood to encompass the plural as well as the singular. The compositions and methods of the present disclosure can comprise, consist of, or consist essentially of the essential elements and limitations of the disclosure described herein, as well as any additional or optional ingredients, components, or limitations described herein or otherwise useful.

All percentages, parts and ratios herein are based upon the total weight of the compositions of the present disclosure, unless otherwise indicated. All ranges and values disclosed herein are inclusive and combinable. The expression "inclusive" for a range of concentrations means that the limits of the range are included in the defined interval. For examples, any value or point described herein that falls within a range described herein can serve as a minimum or maximum value to derive a sub-range, etc. Furthermore, all ranges provided are meant to include every specific range within, and combination of sub ranges between, the given ranges. Thus, a range from 1-5, includes specifically 1, 2, 3, 4 and 5, as well as sub ranges such as 2-5, 3-5, 2-3, 2-4, 1-4, etc.

Other than in the operating examples, or where otherwise indicated, all numbers expressing quantities of ingredients and/or reaction conditions are to be understood as being modified in all instances by the term "about," meaning within +/−5% of the indicated number.

As used herein, the expression "at least one" is interchangeable with the expression "one or more" and thus includes individual components as well as mixtures/combinations.

Throughout the disclosure, the term "a mixture thereof" or "a combination thereof" may be used following a list of elements as shown in the following example where letters A-F represent the elements: "one or more elements selected from the group consisting of A, B, C, D, E, F, and a mixture thereof." The term, "a mixture thereof" or "a combination thereof" does not require that the mixture include all of A, B, C, D, E, and F (although all of A, B, C, D, E, and F may be included). Rather, it indicates that a mixture and/or a combination of any two or more of A, B, C, D, E, and F can be included. For example, it is equivalent to the phrase "one or more elements selected from the group consisting of A, B, C, D, E, F, and a mixture of any two or more of A, B, C, D, E, and F."

Likewise, the term "a salt thereof" also relates to "salts thereof." Thus, where the disclosure refers to "an element selected from the group consisting of A, B, C, D, E, F, a salt thereof, and a mixture thereof," it indicates that that one or more of A, B, C, D, and F may be included, one or more of a salt of A, a salt of B, a salt of C, a salt of D, a salt of E, and a salt of F may be included, or a mixture (or combination) of any two of A, B, C, D, E, F, a salt of A, a salt of B, a salt of C, a salt of D, a salt of E, and a salt of F may be included. The salts referred to throughout the disclosure may include salts having a counter-ion such as an alkali metal, alkaline earth metal, or ammonium counter-ion. This list of counter-ions, however, is non-limiting.

All components and elements positively set forth in this disclosure can be negatively excluded from the claims. In other words, the systems or methods of the instant disclosure can be free or essentially free of all components, features, elements, and more method steps positively recited throughout the instant disclosure.

All publications and patent applications cited in this specification are herein incorporated by reference, and for any and all purposes, as if each individual publication or patent application were specifically and individually indicated to be incorporated by reference. In the event of an inconsistency between the present disclosure and any publications or patent application incorporated herein by reference, the present disclosure controls.

What is claimed is:

1. A method for producing nitrates, nitrites, nitric acid, salts thereof, or a mixture thereof, the method comprising:
   producing an effluent stream comprising one or more oxidized nitrogen species from using a plasma reactor, the plasma reactor producing the one or more oxidized nitrogen species by producing a plasma comprising nitrogen and oxygen from an inlet stream comprising nitrogen and oxygen;
   producing one or more of NO, $NO_2$, nitric acid, nitrates, nitrites, salts thereof, or a mixture thereof from the effluent stream comprising the one or more oxidized nitrogen species using an absorber;
   removing at least a portion of the one or more oxidized nitrogen species from the effluent stream using the absorber, such that the absorber produces a gas phase stream and a liquid phase, wherein the liquid phase comprises the produced nitrates, nitrites, nitric acid, salts thereof, or a mixture thereof;
   combining the gas phase stream produced by the absorber with a feed stream comprising air;
   pressurizing the combined gas phase stream produced by the absorber and the feed stream to a pressure from 1 psig to 10 psig using a first blower or a first compressor; and
   recycling the combined gas phase stream produced by the absorber and the feed stream to the inlet stream, such that the inlet stream comprises the gas phase stream produced by the absorber and the feed stream.

2. The method of claim 1, wherein the plasma of nitrogen and oxygen is produced as non-thermal plasma of nitrogen and oxygen.

3. The method of claim 1, wherein the absorber removes the at least a portion of the one or more oxidized nitrogen species from the effluent stream by bubbling the effluent stream through the liquid phase.

4. The method of claim 1, wherein the liquid phase comprises one or more of water and a basic compound chosen from calcium carbonate, sodium hydroxide, potassium hydroxide, and a mixture thereof.

5. The method of claim 1, wherein the gas phase stream is fluidically coupled to an oxidation chamber comprising a reaction volume to enhance the oxidation of nitrogen species with oxygen, ozone, or heterogeneous catalysis.

6. The method of 5, wherein the oxidation chamber contains a catalyst comprising of platinum, palladium, rhodium, alumina, molybdenum, oxides thereof, or a mixture thereof.

7. The method of claim 1, wherein the feed stream comprises molecular oxygen to molecular nitrogen in a weight ratio of about 1:1 to about 5:1.

8. The method of claim 1, wherein the feed stream comprises molecular oxygen to molecular nitrogen in a weight ratio of about 3:2 to about 4:1.

9. The method of claim 1 further comprising:
   pressurizing or depressurizing, using a second blower or a second compressor, one or more of the inlet stream and the effluent stream.

10. The method of claim 1, wherein the recycled stream provides unabsorbed oxidized nitrogen species to the plasma reactor.

11. The method of claim 1 further comprising: equilibrating the pressure in the effluent stream and the recycled stream.

12. The method of claim 1 further comprising: reducing the pressure drop across the absorber.

13. The method of claim 12, wherein a bypass valve is opened to allow the pressure upstream from the absorber to equal the pressure downstream the absorber.

14. The method of claim 13, wherein the bypass valve is fluidically coupled to the effluent stream and fluidically coupled to the recycle stream.

15. The method of claim 1, further comprising purging the gas phase stream produced by the absorber prior to combining the gas phase stream produced by the absorber with the feed stream.

16. The method of claim 15, wherein purging the gas phase stream produced by the absorber reduces the pressure of the gas phase stream produced by the absorber.

17. The method of claim 15, wherein a purge stream produced by purging the gas phase stream is located downstream from the absorber and upstream from the combined gas phase stream produced by the absorber and the feed stream.

* * * * *